(12) United States Patent
Amin et al.

(10) Patent No.: US 11,548,810 B2
(45) Date of Patent: Jan. 10, 2023

(54) TEXTURED GLASS-BASED ARTICLES WITH SCRATCH RESISTANCE AND METHODS OF MAKING THE SAME

(71) Applicant: CORNING INCORPORATED, Corning, NY (US)

(72) Inventors: Jaymin Amin, Corning, NY (US); Robert Randall Hancock, Jr., Corning, NY (US); Raymond Chih Chung Hsiao, Painted Post, NY (US); Yuhui Jin, Painted Post, NY (US); Aize Li, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 1026 days.

(21) Appl. No.: 16/129,091

(22) Filed: Sep. 12, 2018

(65) Prior Publication Data

US 2022/0194844 A1 Jun. 23, 2022

Related U.S. Application Data

(60) Provisional application No. 62/558,526, filed on Sep. 14, 2017.

(51) Int. Cl.
*C03C 15/00* (2006.01)
*C03C 21/00* (2006.01)
*H05K 5/00* (2006.01)
*H05K 5/03* (2006.01)

(52) U.S. Cl.
CPC ............ *C03C 15/00* (2013.01); *C03C 21/002* (2013.01); *H05K 5/0017* (2013.01); *H05K 5/03* (2013.01)

(58) Field of Classification Search
None
See application file for complete search history.

(56) References Cited

U.S. PATENT DOCUMENTS

| 8,969,226 B2 | 3/2015 | Dejneka et al. |
| 9,290,407 B2 | 3/2016 | Barefoot et al. |
| 11,208,344 B2* | 12/2021 | Hancock, Jr. ............ C03C 3/091 |
| 2011/0267698 A1* | 11/2011 | Guilfoyle ............ B81C 1/00539 977/773 |

(Continued)

FOREIGN PATENT DOCUMENTS

| CN | 101939266 A | 1/2011 |
| CN | 102448904 A | 5/2012 |

(Continued)

OTHER PUBLICATIONS

International Search Report and Written Opinion PCT/US2018/051008 dated Dec. 21, 2018.

(Continued)

*Primary Examiner* — David Sample
(74) *Attorney, Agent, or Firm* — William Tucker; Kevin Johnson

(57) ABSTRACT

An article that includes: a glass-based substrate comprising a thickness, a primary surface and a compressive stress region that extends from the primary surface to a selected depth; and a textured region defined by the primary surface. The textured region comprises a surface roughness ($R_a$) of at least 10 nm. The article can also comprise a Knoop Scratch Threshold of at least 9 Newtons (N).

19 Claims, 10 Drawing Sheets

(56) References Cited

U.S. PATENT DOCUMENTS

| | | | |
|---|---|---|---|
| 2012/0134025 A1* | 5/2012 | Hart | C03C 19/00 |
| | | | 359/601 |
| 2015/0336843 A1 | 11/2015 | Gomez et al. | |
| 2016/0115464 A1 | 4/2016 | Tomashek et al. | |
| 2016/0236974 A1 | 8/2016 | Sinapi et al. | |
| 2017/0276995 A1* | 9/2017 | Sato | B29D 11/00788 |

FOREIGN PATENT DOCUMENTS

| | | | |
|---|---|---|---|
| CN | 104661976 A | 5/2015 | |
| CN | 104684858 A | 6/2015 | |
| CN | 106458702 A | 2/2017 | |
| CN | 110678426 A | 1/2020 | |
| JP | 2013-173661 A | 9/2013 | |
| TW | 200948734 A | 12/2009 | |
| WO | 2009099615 A1 | 8/2009 | |
| WO | 2011034898 A1 | 3/2011 | |
| WO | 2014012003 A2 | 1/2014 | |
| WO | 2015179345 A1 | 11/2015 | |
| WO | WO-2016040151 A1 * | 3/2016 | C03C 3/087 |
| WO | WO-2016113970 A1 * | 7/2016 | C03C 19/00 |
| WO | 2016201027 A2 | 12/2016 | |
| WO | 2018182996 A1 | 10/2018 | |

OTHER PUBLICATIONS

Taiwanese Patent Application No. 107132349, Office Action, dated Jun. 1, 2022, 1 page; Taiwanese Patent Office.

Chinese Patent Application No. 201880060019.1, Office Action dated Jan. 28, 2022, 5 pages English Translation Only), Chinese Patent Office.

* cited by examiner

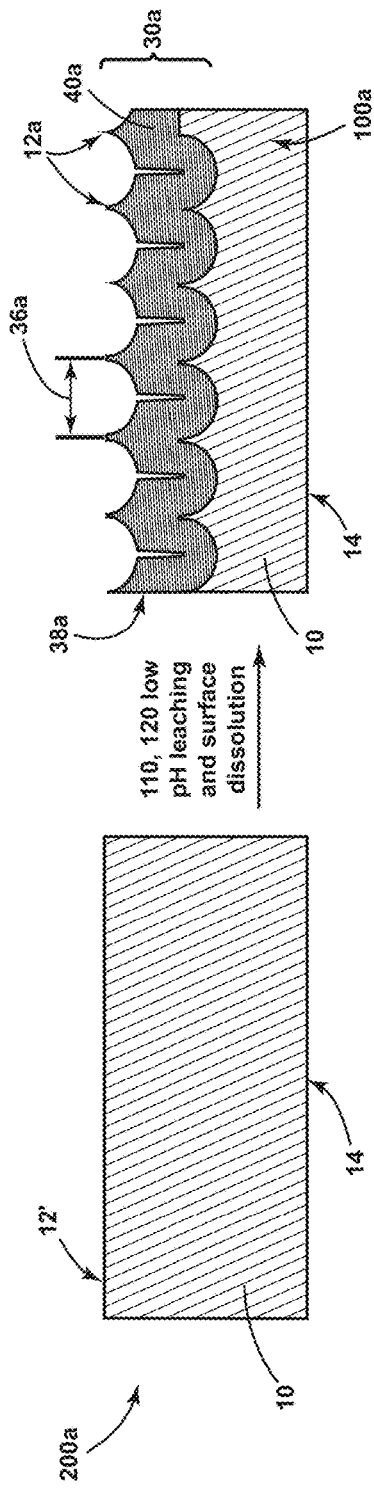
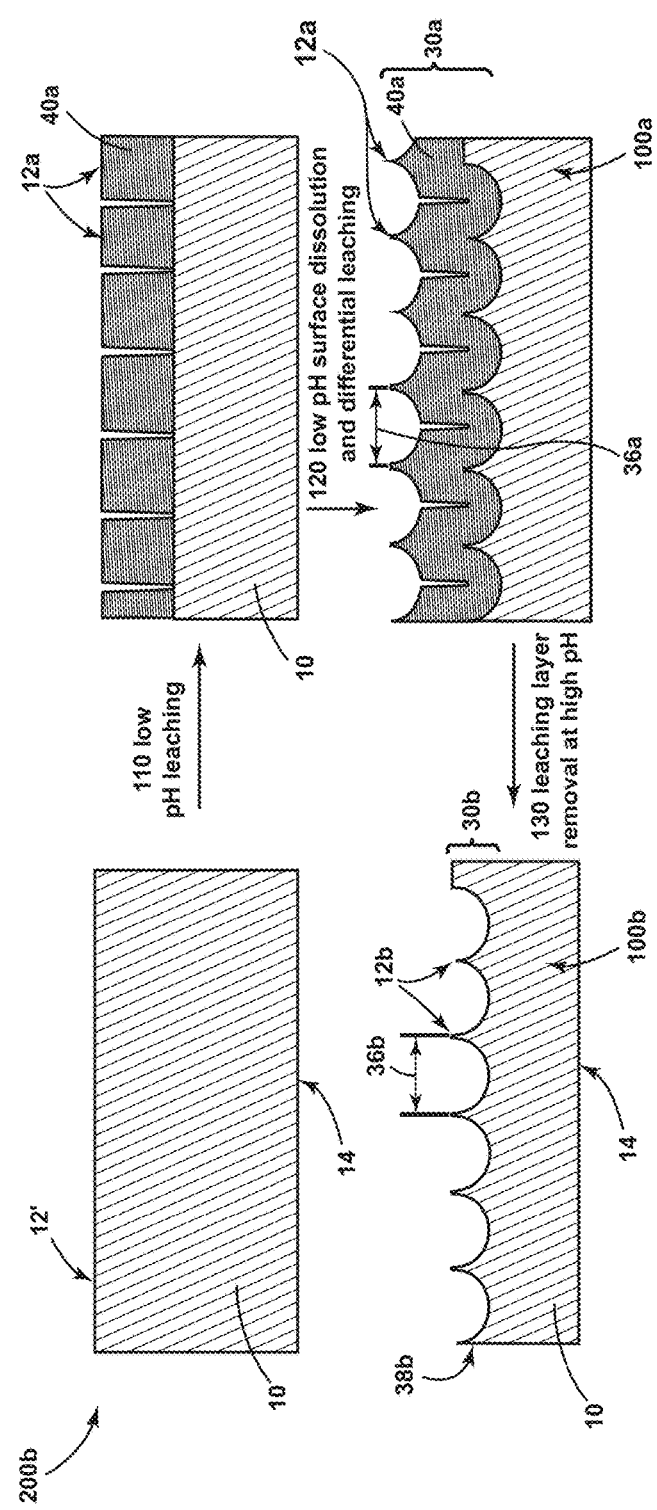
FIG. 3A
FIG. 3B

TEXTURED GLASS-BASED ARTICLES WITH SCRATCH RESISTANCE AND METHODS OF MAKING THE SAME

CROSS-REFERENCE TO RELATED APPLICATIONS

This application claims the benefit of priority of U.S. Provisional Application Ser. No. 62/558,526 filed on Sep. 14, 2017, the contents of which are relied upon and incorporated herein by reference in their entirety.

FIELD

The present disclosure generally relates to articles with scratch resistance, including glass-based, textured articles with scratch resistance, and methods of making the same.

BACKGROUND

Antiglare surfaces are often used in display devices such as LCD screens, OLEDs and touch screens to avoid or reduce specular reflection of ambient light. In many display devices, these antiglare surfaces are formed by providing a level of roughness to one or more surfaces of a glass-based substrate to spread and scatter incident light. Antiglare surfaces in the form of a roughened glass surface are often used on the front surfaces of these display devices to reduce the apparent visibility of external reflections from the display and improve readability of the display under differing lighting conditions. These roughened surfaces are also employed in some display device applications, particularly touch screens, to improve tactile feeling.

In addition to their optical property requirements, antiglare surfaces employed in display devices often must possess various mechanical properties. For example, the glass-based substrate underlying an antiglare surface can often function to provide sufficient strength and other attributes manifested in strength and drop resistance. Further, the antiglare surfaces are often required to possesses wear and scratch resistance, particularly when such surfaces are employed in display devices with touchscreen applications and functionality. Conventional antiglare surfaces, however, often suffer from low scratch resistance, often necessitating an additional coating structure with better scratch resistance that does not diminish the optical properties of the antiglare surface. Yet these additional coating structures require additional processing and can significantly increase the cost of the device employing the coating.

Conventional approaches to making textured surfaces on glass-based substrates also can suffer from the use of treatments that employ aggressive acids, such as hydrofluoric acid, that are not considered environmentally friendly and are costly to employ in manufacturing. Further, other conventional approaches to creating antiglare surfaces employ additional coatings which can increase manufacturing cost and produce unwanted optical effects.

In view of these considerations, there is a need for articles with scratch resistance, including glass-based, textured articles. There is also a need for methods of making these articles, including hydrofluoric acid-free methods, and other relatively low cost methods.

SUMMARY

An aspect of this disclosure pertains to an article that includes: a glass-based substrate comprising a thickness, a primary surface and a compressive stress region that extends from the primary surface to a selected depth; and a textured region defined by the primary surface. The textured region comprises a surface roughness ($R_a$) of at least 10 nanometers (nm).

Another aspect of the disclosure pertains to an article that includes: a glass-based substrate comprising a thickness, a primary surface and a compressive stress region that extends from the primary surface to a selected depth; and a textured region defined by the primary surface. Further, the article comprises a Knoop Scratch Threshold (KST) of at least 9 Newtons (N).

In embodiments, the foregoing articles are further configured such that the textured region comprises a surface roughness ($R_a$) from about 10 nm to about 50 nm. In some embodiments, the textured region comprises a surface roughness ($R_a$) from about 50 nm to about 200 nm.

According to some embodiments, the foregoing articles can be further characterized by a haze from about 0.1% to about 100%. In some embodiments, the articles can be further characterized by a haze from about 5% to about 65%.

In embodiments, the foregoing articles are further configured such that the glass-based substrate is selected from the group consisting of an aluminosilicate glass, a borosilicate glass, and a phosphosilicate glass.

According to some embodiments of the foregoing articles, the article further comprises a Knoop Scratch Threshold (KST) from about 9 N to about 18 N. The articles can also comprise a KST from about 18 N to about 22 N. Further, in some implementations of these articles, the article can comprise a maximum average crack width of about 200 μm, upon testing with a Knoop Scratch Test, as measured at the Knoop Scratch Threshold.

According to an additional aspect of the disclosure, a consumer electronic product is provided that includes: a housing having a front surface, a back surface and side surfaces; electrical components provided at least partially within the housing, the electrical components including at least a controller, a memory, and a display, the display being provided at or adjacent to the front surface of the housing; and a cover substrate disposed over the display. Further, at least one of a portion of the housing or the cover substrate includes one or more of the foregoing articles according to an aspect of the disclosure.

According to another aspect of the disclosure, a consumer electronic product is provided that includes: a housing having a front surface, a back surface and side surfaces; electrical components provided at least partially within the housing, the electrical components including at least a controller, a memory, and a display, the display being provided at or adjacent to the front surface of the housing; and a cover substrate disposed over the display. Further, at least one of a portion of the housing or the cover substrate includes an article according to an aspect of the disclosure, in which the glass-based substrate further comprises a compressive stress region that extends from the primary surface to a selected depth.

A further aspect of the disclosure pertains to a method of making one of the foregoing articles, including the steps: etching an initial primary surface of a glass-based substrate having a thickness with a first etchant having a pH of about 3 or less, wherein the etching is conducted above ambient temperature and below 100° C. to form a porous leached layer that is defined by the initial primary surface of the glass-based substrate. Further, the method includes: treating the glass-based substrate with a second etchant having a pH of about 9 or greater to remove the leached layer and form a textured region defined by a primary surface of the glass-based substrate, wherein the treating is conducted above ambient temperature. In addition, the method includes: forming a compressive stress region that extends from the primary surface to a selected depth. Further, the article comprises a Knoop Scratch Threshold (KST) of at least 9 Newtons (N).

Additional features and advantages will be set forth in the detailed description which follows, and will be readily apparent to those skilled in the art from that description or recognized by practicing the embodiments as described herein, including the detailed description which follows, the claims, as well as the appended drawings.

It is to be understood that both the foregoing general description and the following detailed description are merely exemplary, and are intended to provide an overview or framework to understanding the nature and character of the disclosure as it is claimed.

The accompanying drawings are included to provide a further understanding of principles of the disclosure, and are incorporated in, and constitute a part of, this specification. The drawings illustrate one or more embodiment(s) and, together with the description, serve to explain, by way of example, principles and operation of the disclosure. It is to be understood that various features of the disclosure disclosed in this specification and in the drawings can be used in any and all combinations. By way of non-limiting examples, the various features of the disclosure may be combined with one another according to the following aspects.

BRIEF DESCRIPTION OF THE DRAWINGS

These and other features, aspects and advantages of the present disclosure are better understood when the following detailed description of the disclosure is read with reference to the accompanying drawings, in which:

FIG. 3A is a schematic, flow chart depicting a method of making an article as depicted in FIG. 1A, according to an aspect of the disclosure.

FIG. 3B is a schematic, flow chart depicting a method of making an article as depicted in FIG. 1B, according to an aspect of the disclosure.

DETAILED DESCRIPTION

Figure 1A:
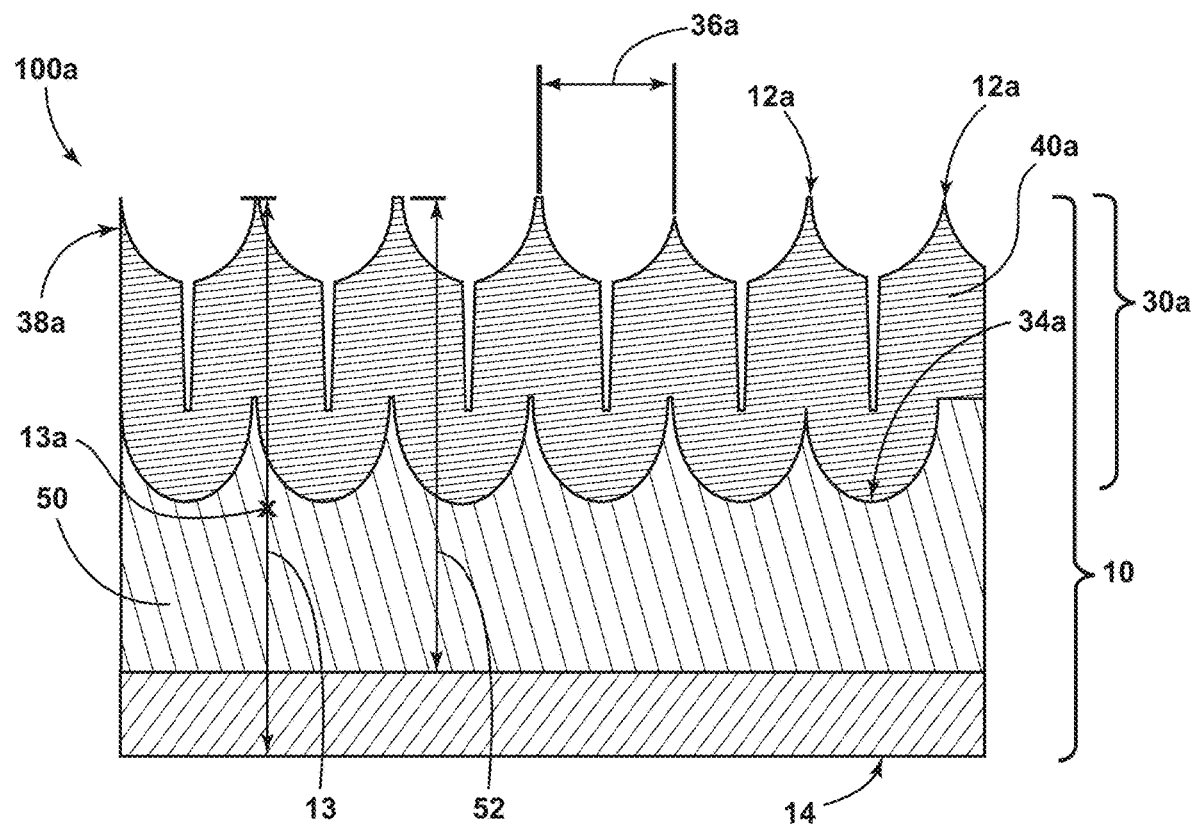
FIG. 1A is a cross-sectional, schematic view of an article that includes a glass-based substrate comprising a compressive stress region, and a textured region, according to an aspect of the disclosure.

In the following detailed description, for purposes of explanation and not limitation, example embodiments disclosing specific details are set forth to provide a thorough understanding of various principles of the present disclosure. However, it will be apparent to one having ordinary skill in the art, having had the benefit of the present disclosure, that the present disclosure may be practiced in other embodiments that depart from the specific details disclosed herein. Moreover, descriptions of well-known devices, methods and materials may be omitted so as not to obscure the description of various principles of the present disclosure. Finally, wherever applicable, like reference numerals refer to like elements.

Ranges can be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

Directional terms as used herein—for example up, down, right, left, front, back, top, bottom—are made only with reference to the figures as drawn and are not intended to imply absolute orientation.

Unless otherwise expressly stated, it is in no way intended that any method set forth herein be construed as requiring that its steps be performed in a specific order. Accordingly, where a method claim does not actually recite an order to be followed by its steps, or it is not otherwise specifically stated in the claims or descriptions that the steps are to be limited to a specific order, it is in no way intended that an order be inferred, in any respect. This holds for any possible non-express basis for interpretation, including: matters of logic with respect to arrangement of steps or operational flow; plain meaning derived from grammatical organization or punctuation; the number or type of embodiments described in the specification.

As used herein, the singular forms "a," "an" and "the" include plural referents unless the context clearly dictates otherwise. Thus, for example, reference to a "component" includes aspects having two or more such components, unless the context clearly indicates otherwise.

As used herein, the terms "glass-based article" and "glass-based substrates" are used in their broadest sense to include any object made wholly or partly of glass, glass-ceramic, or combinations thereof. Glass-based articles include laminates of glass and non-glass materials, laminates of glass and crystalline materials, and glass-ceramics (including an amorphous phase and a crystalline phase). "Glass-ceramics" include materials produced through controlled crystallization of glass. In embodiments, glass-ceramics have about 30% to about 90% crystallinity. Non-limiting examples of glass ceramic systems that may be used include $Li_2O \times Al_2O_3 \times nSiO_2$ (i.e., an LAS system), $MgO \times Al_2O_3 \times nSiO_2$ (i.e., an MAS system), and $ZnO \times Al_2O_3 \times nSiO_2$ (i.e., an ZAS system). Unless otherwise specified, all compositions are expressed in terms of mole percent (mol %).

Glass-based substrates according to one or more embodiments of the articles of the disclosure can be selected from soda lime glass, alkali aluminosilicate glass, alkali-containing borosilicate glass, alkali aluminoborosilicate glass and phosphosilicate glass. In some embodiments, glass-based substrates according to the disclosure can also include multi-component glass materials, such as aluminosilicate glass, borosilicate glass and phosphosilicate glass, and/or crystalline materials with two or more differing phases or dopants. In one or more embodiments, the substrate is a glass, and the glass can be strengthened, for example, heat strengthened, tempered glass, chemically strengthened glass (for example, strengthened by an ion-exchange process), or glass strengthened by virtue of its laminate structure with layers of glasses having different coefficients of thermal expansion (CTE) so that when formed at an elevated temperature, and then cooled, impart a compressive stress to the glass having the smaller CTE. Accordingly, to impart a compressive stress on the surface of a glass laminate, the clad glass layer comprises glass with a smaller CTE than that of the core glass. In one or more embodiments, strengthened glass-based substrates have a compressive stress (CS) layer with a CS extending within the chemically strengthened glass from a surface of the chemically strengthened glass to a depth of 10 μm or more and up to several tens of microns deep. In one or more embodiments, the glass-based substrate is a chemically strengthened glass-based substrate.

Aspects of the disclosure generally pertain to articles with scratch resistance, including glass-based, textured articles with scratch resistance, and methods of making the same. Aspects of the disclosure include methods of making these articles, including hydrofluoric acid-free methods, and other relatively low cost methods. More generally, the approaches to preparing the articles of the disclosure can generate textured surfaces with features of less than 5 microns on multi-component, glass-based substrates. Further, these articles can comprise a glass-based substrate with a compressive stress region, and a textured region, e.g., comprising a surface roughness ($R_a$) of at least 10 nm. The articles can be characterized with scratch resistance, e.g., as manifested by a Knoop Scratch Threshold of at least 9 N. These articles can also be characterized by particular optical properties associated with their textured region, including anti-glare properties.

Referring to FIG. 1A, an article 100a is depicted as including a glass-based substrate 10 with a plurality of primary surfaces 12a and 14, a thickness 13 and a bulk composition at about the midpoint 13a of the thickness 13. In some embodiments, the bulk composition comprises about 40 mol % to 80 mol % silica. The article 100a also includes a textured region 30a, with a composition having at least 40 mol % silica in some embodiments. In some implementations, the textured region 30a can be formed from or otherwise part of the substrate 10, as shown in FIG. 1A. In such implementations, the textured region 30a is defined between the primary surface 12a and a textured region interface 34a within the substrate 10. In other implementations (not shown), the textured region 30a is present over the substrate 10, with the interface 34a residing between the textured region 30a and the substrate 10. Further, the textured region 30a can be defined by all or a portion of the primary surface 12a of the glass-based substrate 10. Accordingly, the textured region 30a can exist over a portion or all of the overall surface area of the article 100a and the glass-based substrate 10.

As generally depicted in FIG. 1A, the textured region 30a includes a plurality of exposed features on its primary surface 12a with an average feature size 36a and an average roughness 38a. According to some implementations of the article 100a, the exposed features of the textured region 30a, including their average feature size 36a and average roughness 38a, are configured to increase the scratch resistance and/or reduce the level of glare associated with the article when it is employed in a display device. The average feature size 36a is given by an average of the maximum dimension of a sampling of features associated with the textured region 30a, measured according to analytical techniques as understood by those with ordinary skill in the field of this disclosure, for example, by taking a photomicrograph of primary surface 12a at 200× magnification and measuring the maximum dimension of a sampling of at least ten (10) features. Accordingly, the terms "average feature size" and "average maximum dimension" are used interchangeably in the disclosure. In some embodiments, at least some of these features have a peak and a valley. The "maximum dimension" of the exposed features is the greatest distance from one portion of a peak of a feature to another portion of the peak of the feature. In embodiments, the average feature size 36a associated with the textured region 30a of the article 100a is less than about 10 microns. According to some implementations, the average feature size 36a associated with the textured region 30a is less than about 5 microns, less than about 1 micron, or less than about 0.5 microns in some cases. Further, the average feature size 36a can be less than about 10 microns, 9 microns, 8 microns, 7 microns, 6 microns, 5 microns, 4 microns, 3 microns, 2 microns, 1 micron, 0.9 microns, 0.8 microns, 0.7 microns, 0.6 microns, 0.5 microns, 0.4 microns, 0.3 microns, 0.2 microns, 0.1 microns, and all values between these upper limits.

Referring again to the textured region 30a associated with the article 100a depicted in FIG. 1A, the average roughness 38a can be measured as surface roughness, $R_a$, using an interferometer and a sample area of 200 microns by 200 microns. The interferometer used was a ZYGO® NEWVIEW™ 7300 Optical Surface Profiler manufactured by ZYGO® Corporation. The surface roughness is reported as a mean surface roughness. In embodiments, the article 100a can employ a textured region 30a having an average roughness 38a of at least 10 nanometers (nm). In embodiments, the average surface roughness ($R_a$) is from about 10 nm to about 500 nm, from about 10 nm to about 50 nm, from about 50 nm to about 200 nm, and all surface roughness values between these levels. Accordingly, the surface roughness ($R_a$) of the textured region 30a can be about 10 nm, 20 nm, 30 nm, 40 nm, 50 nm, 60 nm, 70 nm, 80 nm, 90 nm, 100 nm, 110 nm, 120 nm, 130 nm, 140 nm, 150 nm, 160 nm, 170 nm, 180 nm, 190 nm, 200 nm, 300 nm, 400 nm, 500 nm, and all surface roughness levels between these amounts.

Referring again to FIG. 1A, the glass-based substrate 10 of the article 100a can be configured with a multi-component glass composition having about 40 mol % to 80 mol % silica and a balance of one or more other constituents, e.g., alumina, calcium oxide, sodium oxide, boron oxide, etc. In some implementations, the bulk composition of the glass-based substrate 10 is selected from the group consisting of an aluminosilicate glass, a borosilicate glass and a phosphosilicate glass. In other implementations, the bulk composition of the glass-based substrate 10 is selected from the group consisting of an aluminosilicate glass, a borosilicate glass, a phosphosilicate glass, a soda lime glass, an alkali aluminosilicate glass, and an alkali aluminoborosilicate glass. In further implementations, the glass-based substrate 10 includes, but is not limited to, glass-ceramic materials that comprise a glass component at about 90% or greater by weight and a ceramic component.

In one embodiment of the article 100a. depicted in FIG. 1A, the glass-based substrate 10 has a bulk composition that comprises an alkali aluminosilicate glass that comprises alumina, at least one alkali metal and, in some embodiments, greater than 50 mol %, $SiO_2$, in other embodiments, at least 58 mol %, and in still other embodiments, at least 60 mol % $SiO_2$, wherein the ratio ($Al_2O_3$ (mol %)+$B_2O_3$ (mol %))/Σ alkali metal modifiers (mol %)>1, where the modifiers are alkali metal oxides. This glass, in particular embodiments, comprises, consists essentially of, or consists of: about 58 mol % to about 72 mol % $SiO_2$; about 9 mol % to about 17 mol % $Al_2O_3$; about 2 mol % to about 12 mol % $B_2O_3$; about 8 mol % to about 16 mol % $Na_2O$; and 0 mol % to about 4 mol % $K_2O$, wherein the ratio ($Al_2O_3$ (mol %)+$B_2O_3$ (mol %))/Σ alkali metal modifiers (mol %)>1, where the modifiers are alkali metal oxides.

In another embodiment of the article 100a, as shown in FIG. 1A, the glass-based substrate 10 has a bulk composition that comprises an alkali aluminosilicate glass comprising, consisting essentially of, or consisting of: about 61 mol % to about 75 mol % $SiO_2$; about 7 mol % to about 15 mol % $Al_2O_3$; 0 mol % to about 12 mol $B_2O_3$; about 9 mol % to about 21 mol % $Na_2O$; 0 mol % to about 4 mol % $K_2O$; 0 mol % to about 7 mol % MgO; and 0 mol % to about 3 mol CaO.

In yet another embodiment, the glass-based substrate 10 has a bulk composition that comprises an alkali aluminosilicate glass comprising, consisting essentially of, or consisting of: about 60 mol % to about 70 mol % $SiO_2$; about 6 mol % to about 14 mol % $Al_2O_3$; 0 mol % to about 15 mol % $B_2O_3$; 0 mol % to about 15 mol % $Li_2O$; 0 mol % to about 20 mol % $Na_2O$; 0 mol % to about 10 mol % $K_2O$, 0 mol % to about 8 mol % MgO; 0 mol % to about 10 mol % CaO; 0 mol % to about 5 mol % $ZrO_2$; 0 mol % to about 1 mol % $SnO_2$; 0 mol % to about 1 mol % $CeO_2$, less than about 50 ppm $As_2O_3$; and less than about 50 ppm $Sb_2O_3$; wherein 12 mol %≤$Li_2O$+$Na_2O$+$K_2O$≤20 mol % and 0 mol %≤MgO+Ca≤10 mol %.

In still another embodiment, the glass-based substrate 10 has a bulk composition that comprises an alkali aluminosilicate glass comprising, consisting essentially of, or consisting of: about 64 mol % to about 68 mol % $SiO_2$; about 12 mol % to about 16 mol % $Na_2O$; about 8 mol % to about 12 mol % $Al_2O_3$, 0 mol % to about 3 mol % $B_2O_3$; about 2 mol % to about 5 mol % $K_2O$; about 4 mol % to about 6 mol % MgO; and 0 mol % to about 5 mol % CaO, wherein: 66 mol %≤$SiO_2$+$B_2O_3$+CaO≤69 mol %; $Na_2O$+$K_2O$+$B_2O_3$+MgO+Cao+Sro>10 mol %; 5 mol %≤MgO+CaO+SrO≤8 mol %; ($Na_2O$+$B_2O_3$)—$Al_2O_3$≤2 mol %; 2 mol %≤$Na_2O$—$Al_2O_3$≤6 mol %; and 4 mol %≤($Na_2O$+$K_2O$)—$Al_2O_3$≤10 mol %.

In other embodiments, the glass-based substrate 10 has a bulk composition that comprises $SiO_2$, $Al_2O_3$, $P_2O_5$, and at least one alkali metal oxide ($R_2O$), wherein 0.75>[($P_2O_5$ (mol %)+$R_2O$ (mol %)/$M_2O_3$(mol %)]≤1.2, where $M_2O_3$=$Al_2O_3$+$B_2O_3$. In some embodiments, [($P_2O_5$(mol %)+$R_2O$ (mol %))/$M_2O_3$ (mol %)]=1 and, in some embodiments, the glass-based substrate does not include $B_2O_3$ and $M_2O_3$=$Al_2O_3$. The glass-based substrate comprises, in some embodiments: about 40 to about 70 mol % $SiO_2$; 0 to about 28 mol % $B_2O_3$, about 0 to about 28 mol % $Al_2O_3$; about 1 to about 14 mol % $P_2O_5$; and about 12 to about 16 mol % $R_2O$. In some embodiments, the glass-based substrate comprises: about 40 to about 64 mol % $SiO_2$; 0 to about 8 mol % $B_2O_3$, about 16 to about 28 mol % $Al_2O_3$; about 2 to about 12 mol % $P_2O_5$; and about 12 to about 16 mol % $R_2O$. The glass-based substrate 10 may further comprise at least one alkaline earth metal oxide such as, but not limited to, MgO or CaO.

In some embodiments, the glass-based substrate 10 has a bulk composition that is substantially free of lithium. As used herein, the phrase "substantially free" with respect to the components of the composition means that the component is not actively or intentionally added to the composition during the initial batching, but may be present as an impurity in an amount less than about 0.01 mol %. In some embodiments, the glass-based substrate comprises less than 1 mol % $Li_2O$ and, in other embodiments, less than 0.1 mol % $Li_2O$ and, in other embodiments, less than 0.01 mol % $Li_2O$, and in still other embodiments, 0 mol % $Li_2O$. In some embodiments, such glass-based substrates are substantially free of at least one of arsenic, antimony, and barium. In some embodiments, the glass-based substrates comprise less than 1 mol % and, in other embodiments, less than 0.1 mol %, and in still other embodiments 0 mol % of $As_2O_3$, $Sb_2O_3$, and/or BaO.

As also depicted in FIG. 1A, the textured region 30a of the article 100a can be defined by a porous leached layer 40a that ranges between the primary surface 12a and the textured region interface 34a of the glass-based substrate 10. In some embodiments, the porous leached layer 40a comprises a higher amount of silica than the silica content in the bulk composition of the glass-based substrate 10. As an example for purposes of illustration, an article 100a with a glass-based substrate 10 possessing a bulk composition comprising about 50 mol % silica may include a textured region 30a with a porous leached layer 40a possessing about 70 mol % silica. As will be outlined in greater detail below, the porous leached layer 40a can be created through a low pH treatment of the glass-based substrate 10. Such a treatment can preferentially remove non-silica components of the glass-based substrate 10, thus leaving a porous leached layer 40a with a higher silica content than the bulk composition of the glass-based substrate 10.

Figure 1B:
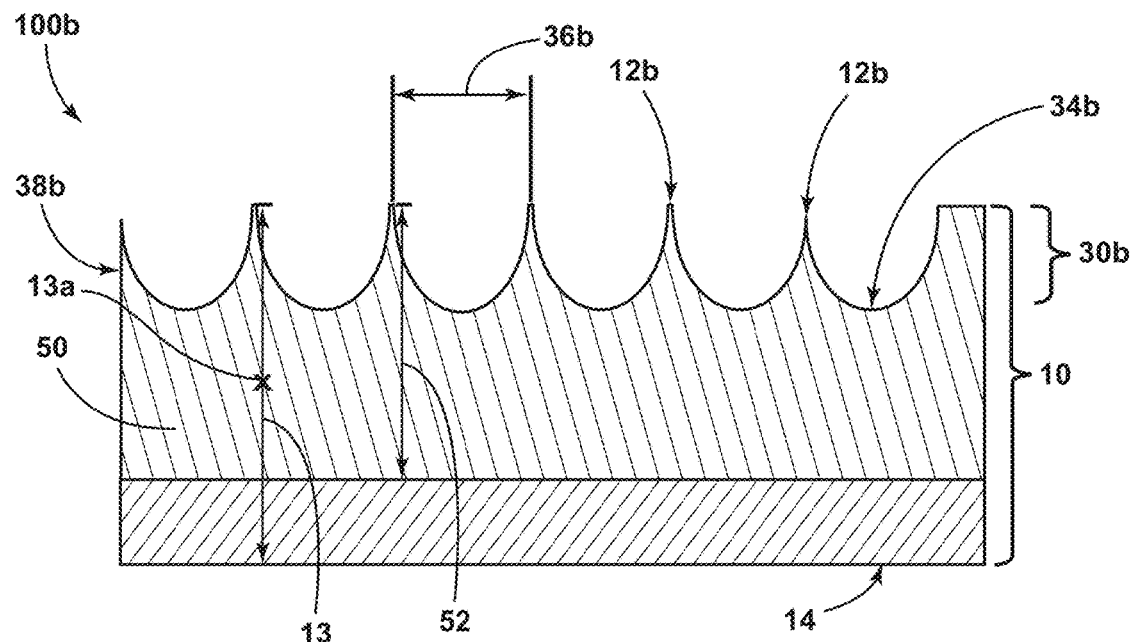
FIG. 1B is a cross-sectional, schematic view of an article that includes a glass-based substrate comprising a compressive stress region, and a textured region, according to an aspect of the disclosure.

Referring now to FIG. 1B, an article 100b is depicted as including a glass-based substrate 10 with a plurality of primary surfaces 12b and 14, a thickness 13 and a bulk composition at the midpoint 13a of the thickness 13. In some embodiments, the bulk composition comprises about 40 mol % to 80 mol % silica. It should be understood that the article 100b is substantially similar to the article 100a (see FIG. 1A) with regard to function and attributes. Further, unless otherwise noted, like-numbered elements associated with the article 100b depicted in FIG. 1B have the same or equivalent structure and function as the same elements associated with the article 100*a* depicted in FIG. 1A and outlined earlier. The primary difference between the articles 100*a* and 100*b* is that the textured region 30*a* of the article 100*a* can include a porous leached layer 40*a*, as shown in FIG. 1A, and the textured region 30*b* of the article 100*b* is not substantially characterized by a porous leached layer comparable to the porous leached layer 40*a*. Further, the textured region 30*b* can be defined by all or a portion of the primary surface 12*b* of the glass-based substrate 10. Accordingly, the textured region 30*b* can exist over a portion or all of the overall surface area of the article 100*b* and the glass-based substrate 10.

Turning back to FIG. 1B, the article 100*b* includes a textured region 30*b*, with a composition having at least 40 mol % silica in some embodiments. The textured region 30*b* is defined by the primary surface 12*b* and the textured region interface 34*b* of the glass-based substrate 10. As depicted in exemplary fashion in FIG. 1B, the textured region interface 34*b* of the textured region 30*b* is substantially coincident with the primary surface 12*b* of the glass-based substrate 10, as indicative of a textured region 30*b* having little to no depth within the glass-based substrate 10. In other aspects, the primary surface 12*b* of the substrate 10 resides above the textured region interface 34*b*, as indicative of a textured region 30*b* having a depth within the glass-based substrate 10, e.g., as defined from the primary surface 12*b* to a depth given by the textured region interface 34*b* (not shown).

As generally depicted in FIG. 1B, the textured region 30*b* includes a plurality of exposed features on its primary surface 12*b* with an average feature size 36*b* and an average roughness 38*b*. According to some implementations of the article 100*b*, the exposed features of the textured region 30*b*, including their average feature size 36*b* and average roughness 38*b*, are configured to increase scratch resistance and/or reduce the level of glare associated with the article when it is employed in a display device. The average feature size 36*b* is given by an average of the maximum dimension of a sampling of features associated with the textured region 30*b*, measured according to analytical techniques as understood by those with ordinary skill in the field of this disclosure, for example, by taking a photomicrograph of primary surface 12*b* at 200× magnification and measuring the maximum dimension of a sampling of at least ten (10) features. In embodiments, the average feature size 36*b* associated with the textured region 30*b* of the article 100*b* is less than about 10 microns. According to some implementations, the average feature size 36*b* associated with the textured region 30*b* is less than about 5 microns, less than about 1 micron, or less than about 0.5 microns in some cases. Further, the average feature size 36*b* can be less than about 10 microns, 9 microns, 8 microns, 7 microns, 6 microns, 5 microns, 4 microns, 3 microns, 2 microns, 1 micron, 0.9 microns, 0.8 microns, 0.7 microns, 0.6 microns, 0.5 microns, 0.4 microns, 0.3 microns, 0.2 microns, 0.1 microns, and all values between these upper limits.

Referring again to the textured region 30*b* associated with the article 100*b* depicted in FIG. 1B, the average roughness 38*b* can be measured as surface roughness, $R_a$, using the technique described above with reference to FIG. 1A. In embodiments, the article 100*b* can employ a textured region 30*b* having an average roughness 38*b* of at least 10 nanometers (nm). In embodiments of the article 100*b*, the average surface roughness ($R_a$) of the textured region 30*b* is from about 10 nm to about 500 nm, from about 10 nm to about 50 nm, from about 50 nm to about 200 nm, and all surface roughness values between these levels. Accordingly, the surface roughness ($R_a$) of the textured region 30*b* can be about 10 nm, 20 nm, 30 nm, 40 nm, 50 nm, 60 nm, 70 nm, 80 nm, 90 nm, 100 nm, 110 nm, 120 nm, 130 nm, 140 nm, 150 nm, 160 nm, 170 nm, 180 nm, 190 nm, 200 nm, 300 nm, 400 nm, 500 nm, and all surface roughness levels between these amounts.

According to some embodiments of the article 100*b* depicted in FIG. 1B, the textured region 30*b* can be characterized such that its composition is substantially equivalent to the bulk composition of the glass-based substrate 10, particularly with regard to silica content. As will be outlined in greater detail below, the textured region 30*b* can be created through successive low pH and high pH treatments to the glass-based substrate 10. The low pH treatment can preferentially remove non-silica components of the glass-based substrate 10, leaving a porous leached layer 40*a* with a higher silica content than the bulk composition of the substrate 10 (see FIG. 1A). The subsequent high pH treatment, however, can be configured to remove the porous leached layer, leaving a textured region 30*b*, as shown in FIG. 1B, having about the same composition as the bulk composition of the glass-based substrate 10, particularly with regard to silica content.

As generally depicted in FIGS. 1A and 1B, the respective textured regions 30*a*, 30*b* of the articles 100*a*, 100*b* can be configured with antiglare properties and scratch resistance. In some embodiments of these articles 100*a*, 100*b*, the textured region 30*a*, 30*b* is configured to maintain a reduced glare function, e.g., as suitable for display device applications, with antiglare-related optical properties as understood by those with ordinary skill in the field of this disclosure. For example, the articles 100*a*, 100*b* can include a textured region 30*a*, 30*b* that results in a gloss (60°) of less than about 140%, less than 120%, less than 100%, less than 80%, and all values at or below these levels, according to some embodiments. As used herein, "gloss (60°)" refers to a measurement of the antiglare and/or gloss properties of the articles of the disclosure, as obtained by employing a conventional gloss meter to test an exposed surface (e.g., the textured region 30*a*, 30*b*) of the designated article at a viewing angle of 60 degrees with the article set against a black background. Unless otherwise noted, all gloss (60°) measurements reported in the disclosure were obtained on a Rhopoint Instruments glossmeter.

As used herein, the terms "transmission haze" and "haze" refer to the percentage of transmitted light scattered outside an angular cone of about ±2.5° in accordance with ASTM procedure D1003, entitled "Standard Test Method for Haze and Luminous Transmittance of Transparent Plastics," the contents of which is incorporated by reference herein in its entirety. Unless otherwise noted, all haze measurements reported in the disclosure were obtained on a Haze-Guard transmittance meter (Paul N. Gardner Company, Inc.). For an optically smooth surface, transmission haze is generally close to zero. According to implementations of the textured glass articles 100*a*, 100*b* (see FIGS. 1A & 1B), the articles can be characterized by a haze from about 0.1% to about 100%. In other implementations, for particular applications, textured glass articles 100*a*, 100*b* consistent with the principles of this disclosure can be fabricated with haze levels as high as 100%, haze levels ranging from 0.1% to 100%, haze levels from 5% to 65%, and all haze levels between these values. For example, desired haze levels in the articles 100*a*, 100*b* can be obtained by controlling the etching conditions associated with producing the respective textured regions 30*a*, 30*b*. In general, higher acid concentrations and/or etching times can increase the amount of haze associated with a particular article 100*a*, 100*b*.

As used herein, the term "Knoop Scratch Test" is used to refer to a scratch test employed on various articles comprising a substrate, such as the articles of the disclosure, to ascertain the scratch resistance of the tested surface of the substrate. The Knoop Scratch Test is conducted by sliding a Knoop indenter on the exposed surface of a specimen, such as the textured region 30a, 30b of the articles 100a, 100b. In particular, the test is conducted by sliding the Knoop indenter across the exposed surface at a rate of 24 mm/min at a pre-determined load, as measured by a Universal Material Tester. The Knoop indenter is a diamond-tipped, rhombic-based pyramid with 172° 30' and 130° angles. Further, the Knoop Scratch Test is conducted by scratching the exposed surface of the sample at gradually increasing load levels until the specimen show signs of unacceptable damage. For each load level (e.g., in units of Newtons (N)), five (5) separate scratches are made according to the Knoop Scratch Test. A "Knoop Scratch Threshold," as also used herein, is defined as the load level (i.e., as reported in Newtons (N)) employed during the Knoop Scratch Test at which the damage is greater than twice the scratch width for at least 20% of the scratch length. Further, the lowest load level (i.e., as reported in Newtons (N)) that generated this unacceptable damage on the specimen is defined as the Knoop Scratch Threshold.

According to some embodiments, the foregoing articles 100a, 100b (see FIGS. 1A and 1B) can comprise a Knoop Scratch Threshold from about 9N to about 18 N upon testing with a Knoop Scratch Test. The articles 100a, 100b can also comprise a Knoop Scratch Threshold from about 18 N to about 22 N upon testing with a Knoop Scratch Test. Accordingly, the articles 100a, 100b can be characterized by a Knoop Scratch Threshold of about 9 N, 10 N, 11 N, 12 N, 13 N, 14 N, 15 N, 16 N, 17 N, 18 N, 19 N, 20 N, 21 N, 22 N, and all threshold load levels between these amounts. Further, in some implementations of the articles 100a, 100b, the article can comprise a maximum crack width of about 200 µm upon testing with a Knoop Scratch Test. As used herein, the terms "maximum crack width" or "average maximum crack width" are used interchangeably and refer to the average maximum width of the cracks observed in a group of samples tested with the Knoop Scratch Test at the Knoop Scratch Threshold (N). Hence, the average maximum crack width is measured on a group of samples upon reaching the Knoop Scratch Threshold.

According to other embodiments, the glass-based substrate 10 of the articles 100a, 100b (see FIGS. 1A & 1B) can possess an ion-exchangeable glass composition that is strengthened by either chemical or thermal means that are known in the art. In one embodiment, the glass substrate is chemically strengthened by ion exchange. In this process, metal ions at or near a primary surface 12a, 12b of the glass-based substrate 10 (see FIGS. 1A & 1B) are exchanged for larger metal ions having the same valence as the metal ions in the glass substrate. The exchange is generally carried out by contacting the glass-based substrate 10 with an ion exchange medium such as, for example, a molten salt bath that contains the larger metal ion. The metal ions are typically monovalent metal ions such as, for example, alkali metal ions. In one non-limiting example, chemical strengthening of a glass-based substrate 10 that contains sodium ions by ion exchange is accomplished by immersing the glass-based substrate 10 in an ion exchange bath comprising a molten potassium salt, such as potassium nitrate ($KNO_3$), or the like. In one particular embodiment, the ions in the surface layer of the glass-based substrate 10 and the larger ions are monovalent alkali metal cations, such as $Li^+$ (when present in the glass), $Na^+$, $K^+$, $Rb^+$, and $Cs^+$. Alternatively, monovalent cations in the surface layer of the glass-based substrate 10 may be replaced with monovalent cations other than alkali metal cations, such as $Ag^+$ or the like.

In these embodiments, the replacement of small metal ions by larger metal ions in the ion exchange process creates a compressive stress region 50 in the glass-based substrate 10 that is under compressive stress, and that extends from the primary surface 12a, 12b to a depth 52 (see FIGS. 1A & 1B) (referred to as the "depth of compression"). This compressive stress at the primary surface of the glass substrate is balanced by a tensile stress (also referred to as "central tension") within the interior of the glass substrate. In some embodiments, the primary surface 12a or 12b of the glass-based substrate 10 described herein, when strengthened by ion exchange, has a compressive stress of at least 350 MPa, and the region under compressive stress extends to a depth 52, i.e., depth of layer, of at least 15 µm below the primary surface 12a or 12b.

Ion exchange processes for articles 100a, 100b (see FIGS. 1A & 1B) are typically carried out by immersing the glass-based substrate 10 in a molten salt bath containing the larger ions to be exchanged with the smaller ions in the glass, prior to and/or after the development of the textured regions 30a, 30b. It will be appreciated by those skilled in the art that parameters for the ion exchange process, including, but not limited to, bath composition and temperature, immersion time, the number of immersions of the glass in a salt bath (or baths), use of multiple salt baths, additional steps such as annealing, washing, and the like, are generally determined by the composition of the glass and the desired depth of layer and compressive stress of the glass as a result of the strengthening operation. By way of example, ion exchange of alkali metal-containing glasses may be achieved by immersion in at least one molten bath containing a salt such as, but not limited to, nitrates, sulfates, and chlorides of the larger alkali metal ion. The temperature of the molten salt bath typically is in a range from about 380° C. up to about 450° C., while immersion times range from about 15 minutes up to about 16 hours. However, temperatures and immersion times different from those described above may also be used. Such ion exchange treatments, when employed with a glass-based substrate 10 having an alkali aluminosilicate glass composition, result in a compressive stress region 50 having a depth 52 (depth of layer) ranging from about 10 µm up to at least 50 µm with a compressive stress ranging from about 200 MPa up to about 800 MPa, and a central tension of less than about 100 MPa. Further, in one exemplary embodiment, a glass-substrate 10 and a textured region 30b of an article 100b is subjected to an ion-exchange strengthening process that includes: a first immersion in a molten salt bath comprising 70 wt. % $NaNO_3$ and 30 wt. % $KNO_3$ at 380° C. for hours; and a second immersion in a molten salt bath comprising 93 wt. % $NaNO_3$ and 7 wt. % $KNO_3$ at 380° C. for 40 minutes. In another exemplary embodiment, a glass-substrate 10 and a textured region 30b of an article 100b is subjected to an ion-exchange strengthening process that includes a single immersion in a molten salt bath comprising 100 wt. % $KNO_3$ at 420° C. for 5.5 hours.

As the etching and leaching processes that can be employed to create the textured regions 30a, 30b, according to some embodiments, can, in some instances, remove alkali metal ions from the glass-based substrate 10 that would otherwise be replaced by a larger alkali metal ion during an ion exchange process, a preference exists for developing a compressive stress region 50 in the textured glass article 100a, 100b after the formation and development of the textured region 30a, 30b. In other embodiments, a compressive stress region 50 can be developed in the glass-based substrate 10 prior to development of the textured region 30a, 30b to a depth 52 sufficient to account for some loss in the depth of layer in the compressive stress region 50 associated with the low pH, or low and high pH treatments, as outlined below.

Figure 2:
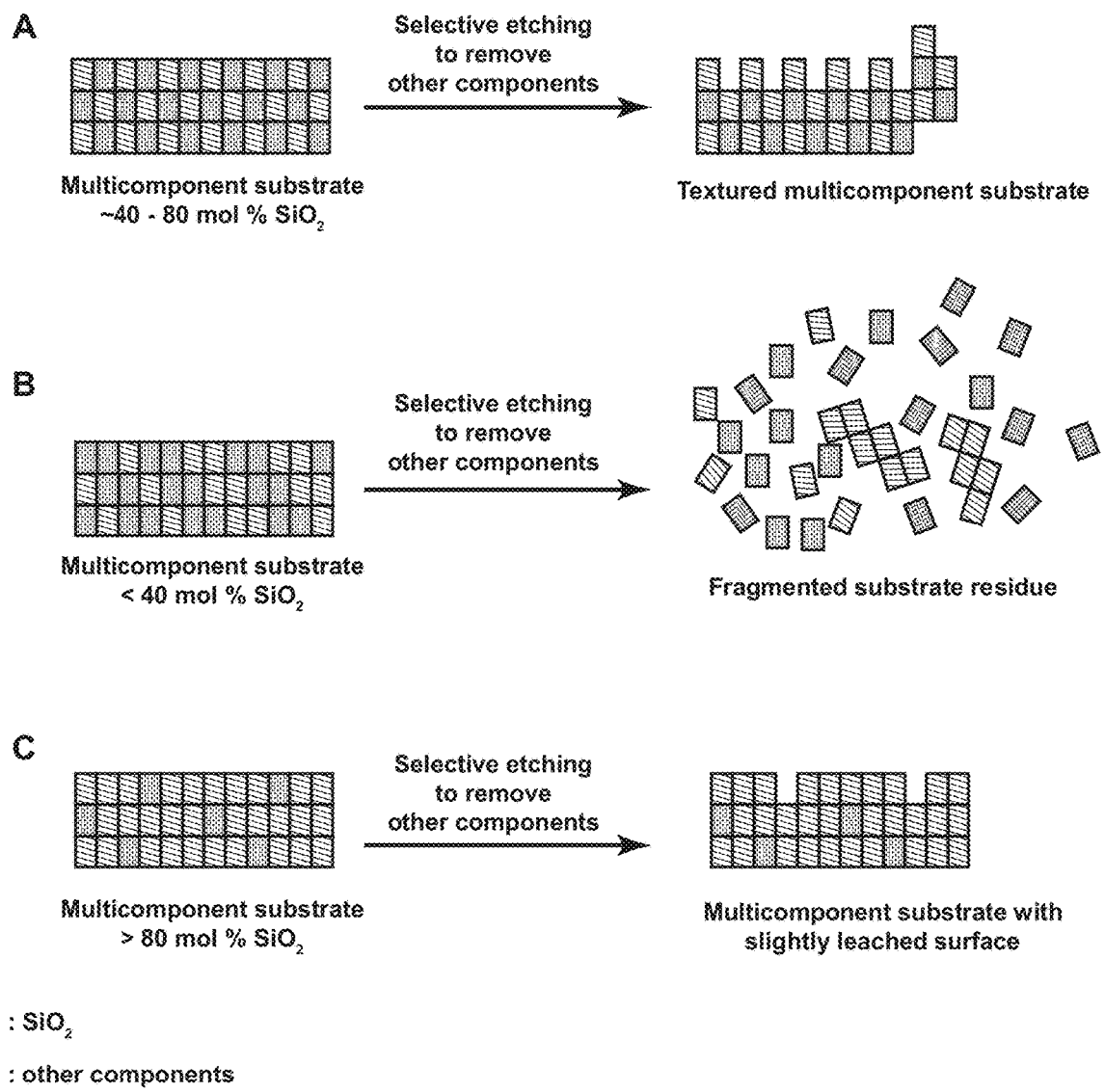
FIG. 2 is a schematic chart depicting the effects of leaching a silica-containing, multicomponent glass-based substrate with varying levels of silica, according to an aspect of the disclosure.

Referring now to FIG. 2, a schematic chart depicts the effects of employing a low pH leaching process according to the disclosure to a silica-containing, multicomponent glass substrate (e.g., a glass substrate comparable to glass-based substrate 10) with varying levels of silica. In portion "A" of FIG. 2, a glass substrate with a composition having about 40 mol % to about 80 mol % silica is subjected to a low pH leaching process and non-silica components (denoted as "other components" in FIG. 2) are removed. The net result is a textured glass article (e.g., as comparable to the article 100a depicted in FIG. 1A) with a textured region having a higher silica content than the bulk composition of the substrate. In contrast, the portions "B" and "C" in FIG. 2 represent the effects of conducting the same low pH process with glass substrate compositions outside the preferred window in terms of silica content. That is, the substrate in portion "B" has a silica content of less than 40 mol %, and this substrate essentially falls apart or significantly degrades from the removal of the non-silica components during the low pH treatment. On the other hand, the substrate in portion "C" has a silica content of greater than 80 mol %, and the surface of this substrate is nearly indistinguishable from the surface of the substrate prior to etching; consequently, the substrate in portion "C" does not possess a textured region consistent with the principles of the disclosure after being subjected to the low pH treatment.

Referring now to FIG. 3A, a schematic, flow chart is provided that depicts a method 200a of making an article, e.g., an article 100a (as depicted in FIG. 1A). As shown, a glass-based substrate 10 is provided with an initial primary surface 12', along with an opposing primary surface 14. An etching step 110, 120 is then conducted to the substrate 10 that includes etching the initial primary surface 12' with an etchant (e.g., a hydrofluoric acid-free etchant) having a pH of about 3 or less. In some embodiments of the method 200a, hydrochloric acid and/or citric acid can be employed as an etchant during step 110, 120. According to an embodiment, step 110, 120 is conducted at an elevated temperature above ambient temperature and below 100° C. Suitable concentration levels for hydrochloric acid etchants, according to some implementations, range from 0.5% to 15% by weight. Suitable concentration levels for citric acid etchants, according to other implementations, range from about 1% to 30% by weight. Upon completion of the etching step 110, 120, a textured region 30a is formed in the article 100a (see also FIG. 1A).

Referring again to FIG. 3A, in some embodiments, the method 200a further includes a removing step configured to remove excess etchant and leached substrate constituents from the etching step 110, 120. That is, after step 110, 120 of the method 200a, excess etchant, along with any constituents from the initial primary surface 12' of the glass-based substrate 10, are then removed by rinsing the etchant on the initial primary surface 12' with deionized water. As would be understood by those with ordinary skill in the field of the disclosure, various mechanical and/or aqueous cleaning approaches can be employed in the removing step to remove excess etchant and leached substrate constituents without materially affecting the surface of the glass-based substrate 10.

In embodiments, the etching step 110, 120 of the method 200a is associated with a low pH leaching portion 110, and a low pH surface dissolution and differential leaching portion 120 (see also FIG. 3B). Without being bound by theory, the low pH leaching portion 110 occurs during an initial period during the etching and results in leaching of non-silica constituents from the glass-based substrate 10. As crevices and other high depth features are created in the initial primary surface 12' of the glass-based substrate 10 during the low pH leaching portion 110, preferential removal of additional non-silica constituents occurs to the glass substrate in these crevice regions (e.g., at a higher leaching rate than surrounding material) during the differential leaching portion 120, leading to the additional development of features below the leached layer 40a. As such, the textured region 30a formed during the etching step 110, 120 can have multiple morphologies, e.g., at the primary surface 12a and at the interface 34a between the leached layer 40a and the underlying glass-based substrate 10 (see FIG. 1A).

As shown in FIG. 3B, a schematic, flow chart is provided that depicts a method 200b of making an article, e.g., an article 100b (as depicted in FIG. 1B). The etching step 110, 120 of the method 200b is the same as employed in the method 200a depicted in FIG. 3A. Further, embodiments of the method 200b can include a removing step conducted after the etching step 110, 120 to remove excess etchant and leached substrate constituents from the etching step 110, 120. More particularly, the completion of the etching step 110, 120 in the method 200b results in an interim article having a textured region 30a and a leached layer 40a (e.g., as comparable to the textured glass article 100a shown in FIGS. 1A and 3A). At this point, the method 200b continues with a treating step 130 conducted by treating the textured region 30a with a second etchant having a pH of about 9 or greater to form a textured region 30b. In embodiments, the second etchant employed during the step 130 is an aqueous, alkaline solution having a pH that ranges from about 9 to about 13. In particular, the leached layer 40a is removed during the treating step 130, leaving the textured region 30b, which is defined by the primary surface 12b of the glass-based substrate 10. In embodiments of the method 200b, the primary surface 12b is initially formed during the differential leaching portion 120 of the etching step 110, 120 and later 'revealed' by the removal of the leached layer 40a during the treating step 130. In some embodiments of the method 200b, the composition of the textured region 30b is substantially equivalent to the bulk composition of the glass-based substrate 10, particularly with regard to silica.

Figure 4A:
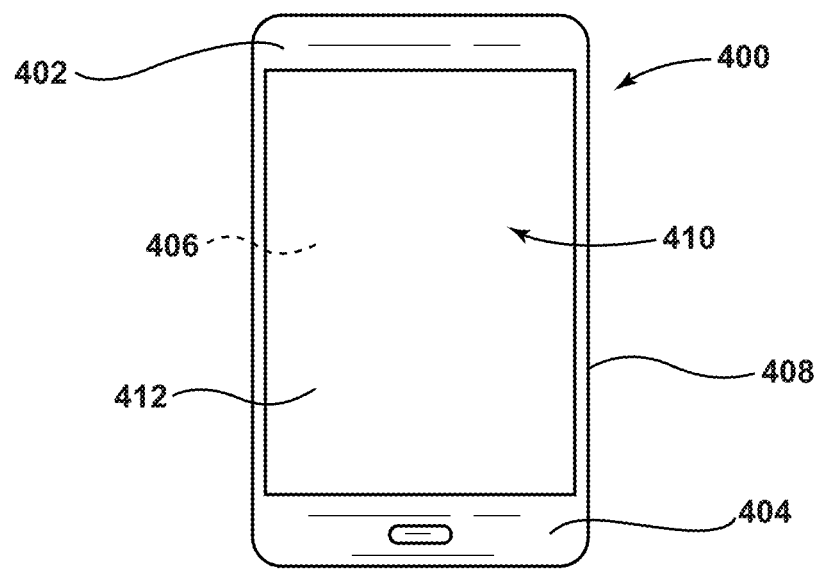
FIG. 4A is a plan view of an exemplary electronic device incorporating any of the articles disclosed herein.
Figure 4B:
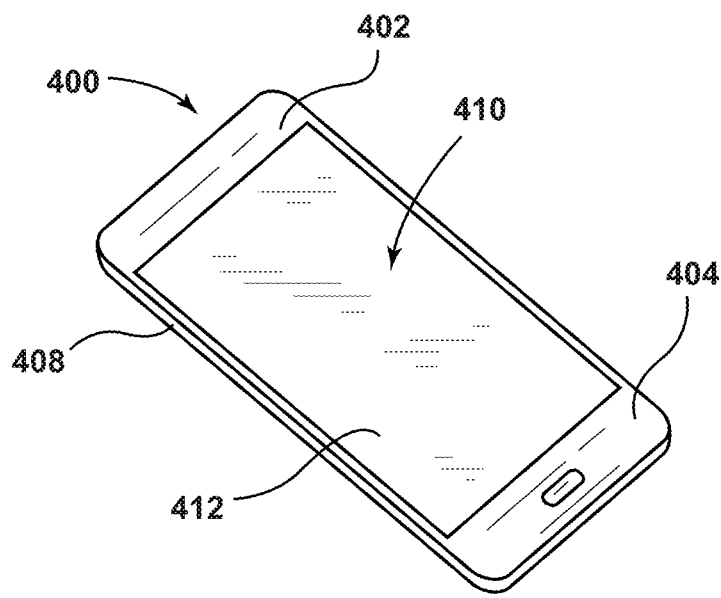
FIG. 4B is a perspective view of the exemplary electronic device of FIG. 4A.

The glass articles disclosed herein, e.g., articles 100a, 100b, may be incorporated into another article such as an article with a display (or display articles) (e.g., consumer electronics, including mobile phones, tablets, computers, navigation systems, and the like), architectural articles, transportation articles (e.g., automotive, trains, aircraft, sea craft, etc.), appliance articles, or any article that requires some transparency, scratch-resistance, abrasion resistance or a combination thereof. An exemplary article incorporating any of the articles disclosed herein, including articles 100a, 100b (see FIGS. 1A & 1B), is shown in FIGS. 4A and 4B. Specifically, FIGS. 4A and 4B show a consumer electronic device 400 including a housing 402 having front 404, back 406, and side surfaces 408; electrical components (not shown) that are at least partially inside or entirely within the housing and including at least a controller, a memory, and a display 410 at or adjacent to the front surface of the housing; and a cover substrate 412 at or over the front surface of the housing such that it is over the display. In some embodiments, at least one of the cover substrate 412, or a portion of housing 402, may include one or more of the articles 100a, 100b disclosed herein.

EXAMPLES

The following examples describe various features and advantages provided by the disclosure, and are in no way intended to limit the invention and appended claims.

Example 1

Figure 5C:
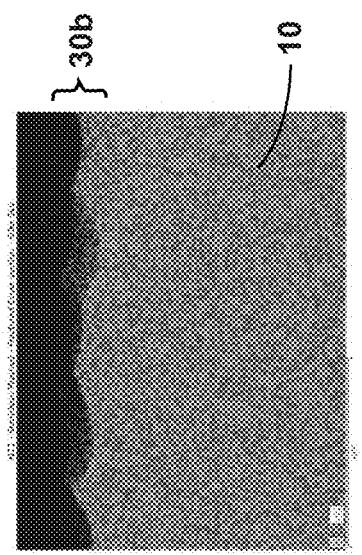
FIGS. 5A-5C are a series of scanning electron microscope, energy dispersive spectroscopy (SEM/EDS) images of an article comprising a glass-based substrate and a textured region, as fabricated according to a method of the disclosure.
Figure 5B:
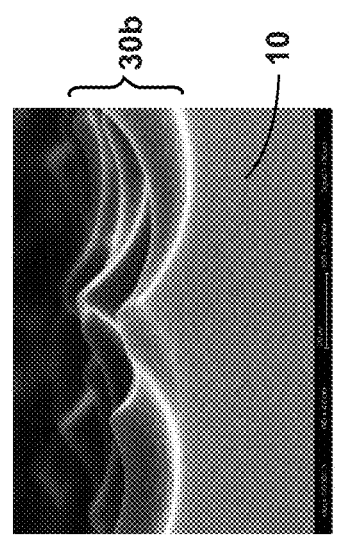
Figure 5A:
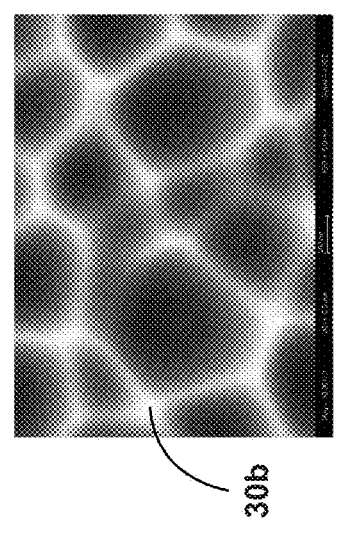

The following example used samples of Glass A for a glass-based substrate. Glass A had an approximate composition on an oxide basis of 63.76 mol % $SiO_2$; 2.37 mol % $B_2O_3$; 15.05 mol % $Al_2O_3$; 9.24 mol % $Na_2O$; 5.88 mol % $Li_2O$; 1.18 mol % ZnO; 2.47 mol % $P_2O_5$; and 0.05 mol % $SnO_2$. Samples of Glass A were etched with 20 wt. % citric acid at 95° C. for 10 hours as part of a low pH treatment step. All samples were rinsed in deionized water and dried at room temperature after the etching step. Further, the samples were then subjected to a high pH treatment employing an alkali cleaner having a pH of about 13 at ambient temperature, followed by rinsing in deionized water and ambient temperature drying. The resulting articles (e.g., comparable to an article 100b, as depicted in FIG. 1B) were then analyzed using scanning electron microscope (SEM) energy dispersive spectroscopy (EDS) techniques. As shown by FIGS. 5A-5C, a series of scanning electron microscope, energy dispersive spectroscopy (SEM/EDS) images of the articles comprising a glass-based substrate and a textured region is provided, as fabricated according to the foregoing method (i.e., a method comparable to method 200b as depicted in FIG. 3B). In particular, a textured region 30b is developed in the samples from the high pH treatment.

Example 2

In this example, samples of Glass A, Glass B and Glass C were prepared and characterized according to Table 1 below. As noted above, Glass A had an approximate composition on an oxide basis of 63.76 mol % $SiO_2$; 2.37 mol % $B_2O_3$; 15.05 mol % $Al_2O_3$; 9.24 mol % $Na_2O$; 5.88 mol % $Li_2O$; 1.18 mol % ZnO; 2.47 mol % $P_2O_5$; and 0.05 mol % $SnO_2$. Glass B had an approximate composition on an oxide basis of 64.9 mol % $SiO_2$; 13.9 mol % $Al_2O_3$; 5.1 mol % $B_2O_3$; 13.6 mol % $Na_2O$; 2.4 mol % MgO; and 0.07 mol % $SnO_2$. Glass C had an approximate composition on an oxide basis of 67.37 mol % $SiO_2$; 3.67 mol % $B_2O_3$; 012.73 mol % $Al_2O_3$; 13.77 mol % $Na_2O$; 0.01 mol % $K_2O$; 2.39 mol % MgO; 0.003 mol % $TiO_2$; 0.01 mol % $Fe_2O_3$; 0.01 mol % $ZrO_2$; and 0.09 mol % $SnO_2$. Samples of Glass A were etched in 20 wt. % citric acid at 95° C. for 10 to 16 hours. Samples of Glass B were also etched in 20 wt. % citric acid at 95° C. for 8 to 24 hours. In addition, samples of Glass C were etched in 5 wt. % hydrochloric acid at 95° C. from 13.5 to 48 hours. All samples were rinsed in deionized water and dried at room temperature after the etching step. Further, the samples were then subjected to a high pH treatment employing an alkali cleaner having a pH of about 13 at 60° C. for 10 min, followed by rinsing in deionized water and ambient temperature drying. Note that both primary surfaces of each sample were subjected to the etching and cleaning treatment steps. The resulting articles are consistent with the articles 100b outlined earlier in the disclosure, as prepared according to a method consistent with the methods outlined earlier in the disclosure.

The treated samples were then characterized for surface roughness ($R_a$), haze, and gloss (60°); and the results are listed below in Table 1. The haze and gloss (60°) measurements were obtained using the protocols outlined earlier in the disclosure. Overall, as demonstrated by Table 1, subjecting the samples to more aggressive low pH etchant conditions (e.g., HCl acid vs. citric acid) and/or longer etching times for the low pH treatment (e.g., 24 to 48 hours vs. 8 and 10 hours) results in greater haze and lower gloss (60°) values.

TABLE 1

| Sample No. | Glass | Etchant | Etchant Conc. (wt. %) | Time (hr) | Haze (%) | Gloss 60° (%) | $R_a$ (nm) | Feature Size (μm) |
|---|---|---|---|---|---|---|---|---|
| Ex. 1A | C | HCl | 5 | 13.5 | 8.27 | 108.4 | 47.1 | 0.65 |
| Ex. 1B | C | HCl | 5 | 24 | 19.20 | 69.6 | 66.9 | 0.98 |
| Ex. 1C | C | HCl | 5 | 48 | 23.90 | 59.9 | 71.2 | 0.1 |
| Ex. 2A | B | citric | 20 | 8 | 1.43 | 136.2 | 19.6 | 0.07 |
| Ex. 2B | B | citric | 20 | 13.5 | 19.10 | 74.7 | 61.5 | 0.1 |
| Ex. 2C | B | citric | 20 | 24 | 61.50 | 9.4 | 121.7 | 0.12 |
| Ex. 3A | A | citric | 20 | 10 | 20.8 | 72.9 | 66.6 | 0.07 |
| Ex. 3B | A | citric | 20 | 13.5 | 41.9 | 29.6 | 94.8 | 0.09 |
| Ex. 3C | A | citric | 20 | 16 | 60.0 | 11.4 | 120.3 | 0.12 |

Figure 6:
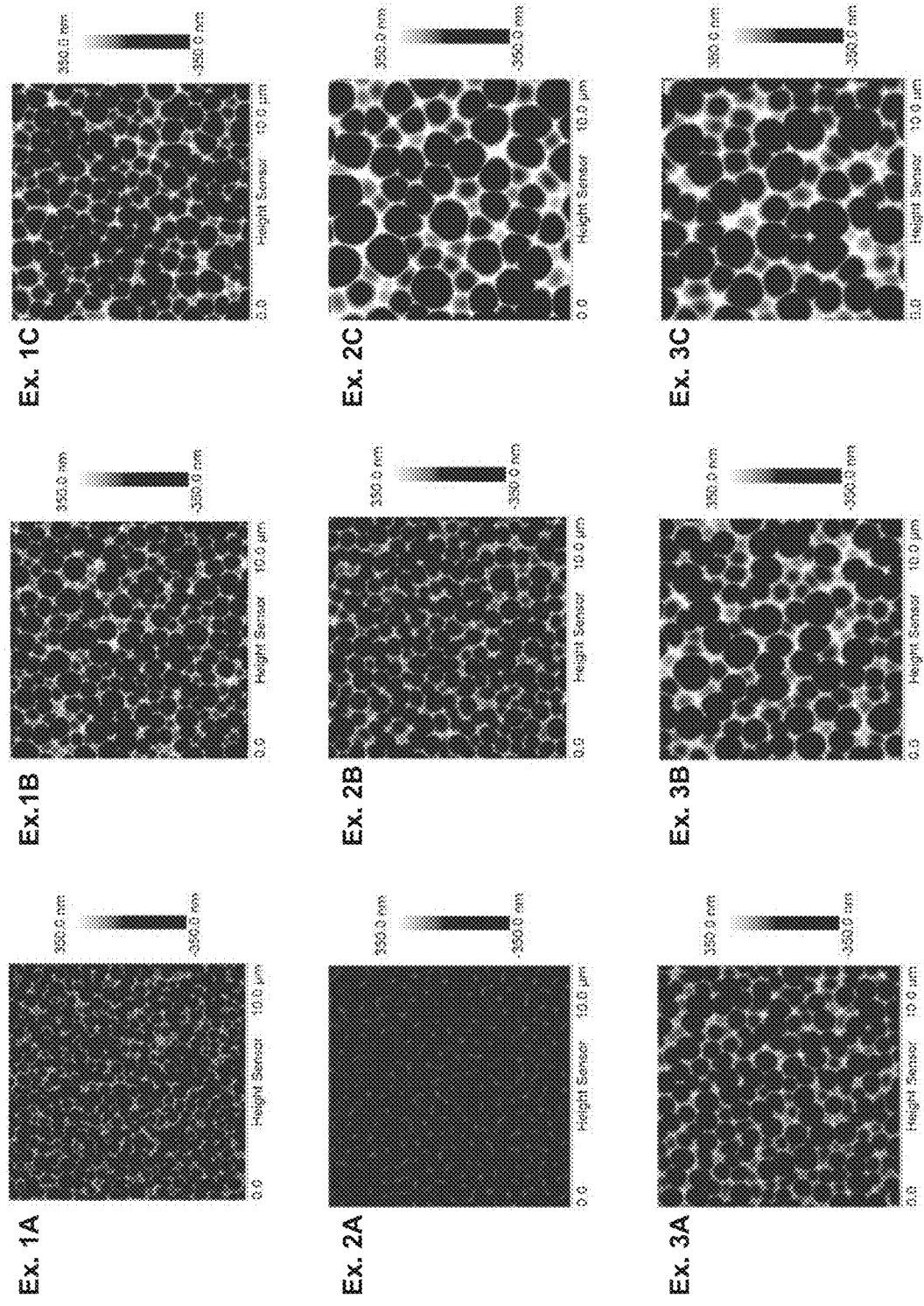
FIG. 6 is a series of SEM/EDS images of articles comprising a glass-based substrate and a textured region, as fabricated according to methods of the disclosure.

Referring again to Table 1 above, the reported surface roughness ($R_a$) measurements were obtained using standard atomic force microscopy (AFM) techniques, as understood by those with ordinary skill in the field of the disclosure. As is evident from the data in Table 1, the more aggressive etchant conditions result in increasing levels of surface roughness and feature sizes. Further, as shown in FIG. 6, a series of SEM/EDS images of the articles in Example 2 (see Table 1 above) demonstrates the same effect. For example, samples Ex. 1A, 2A and 3A, each with low etching durations, demonstrate less roughness than samples Ex. 1C, 2C and 3C, each with longer etching durations. Hence, this example demonstrates that the surface morphology of the textured region of these articles can be controlled through the selection of the low pH etchant and/or etching duration.

Figure 7A:
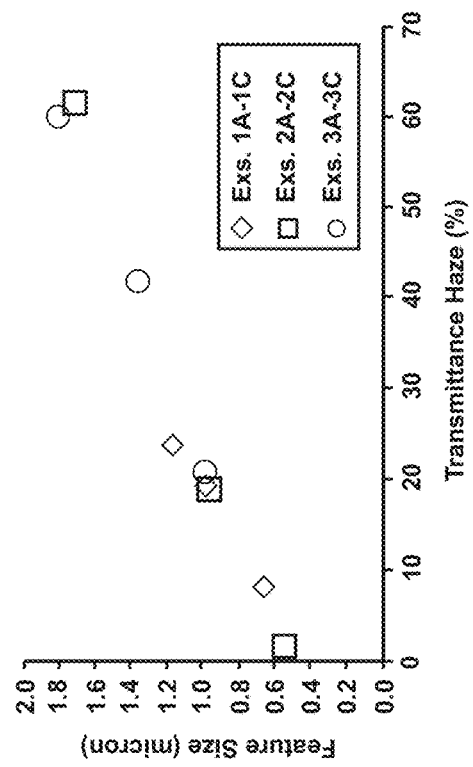
FIGS. 7A-7C are a series of plots of surface roughness, feature size and gloss (60°) vs. transmittance haze of articles that comprise a glass-based substrate and a textured region, according to aspects of the disclosure.
Figure 7B:
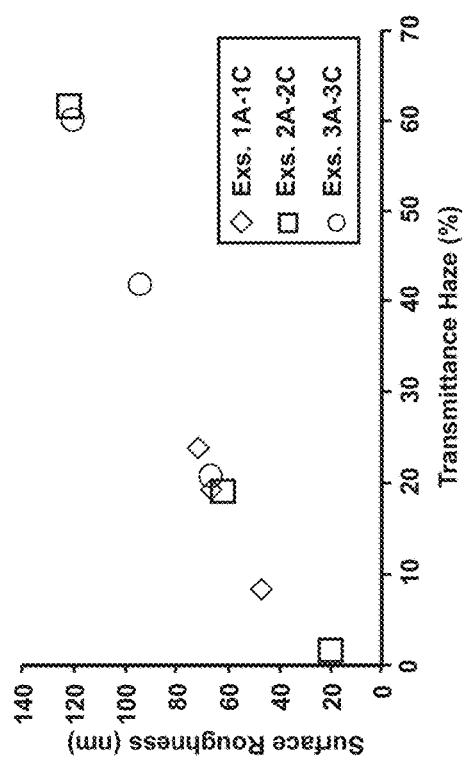
Figure 7C:
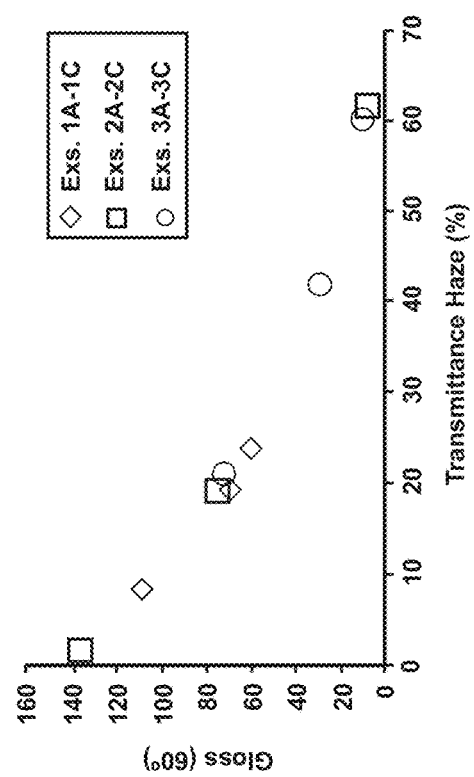

Further, this example demonstrates that surface roughness, feature size and gloss (60°) can be correlated to the observed haze levels. These trends are evident in FIGS. 7A-7C, which plot the results from Table 1. That is, relationships exist between surface roughness ($R_a$) vs. haze (%) (see FIG. 7A); feature size (microns) vs. haze (%) (see FIG. 7B); and gloss (60°) vs. haze (%) (FIG. 7C). It is also evident from this example that the articles processed according to Table 1 each contain features of less than about 1 micron in size, which is smaller than features from conventional etching processes, such as hydrofluoric acid etchants.

Example 3

In this example, samples of Glass A, Glass B and Glass C were prepared and characterized according to Tables 2A and 2B below. A portion of the Glass A samples were etched in 20 wt. % citric acid at 95° C. for 10 to 16 hours. A portion of the Glass B samples were also etched in 20 wt. % citric acid at 95° C. for 8 to 24 hours. In addition, a portion of the Glass C samples were etched in 5 wt. % hydrochloric acid at 95° C. from 13.5 to 48 hours.

Further, these samples were then subjected to a high pH treatment employing an alkali cleaner having a pH of about 13 at 60° C. for 10 min, followed by rinsing in deionized water and ambient temperature drying. Note that both primary surfaces of each sample were subjected to the etching and cleaning treatment steps. All of these samples were rinsed in deionized water and dried at room temperature after the etching step. Further, some of the samples subjected to the low pH and high pH etching treatment were subjected to mechanical polishing as control samples (i.e., designated as "polish" in Tables 2A and 2B). The polishing removed any textured region produced by the etching treatment. In addition, the remaining samples comprising Glass A-C compositions were not subjected to any etching treatment; accordingly, these articles were characterized by fusion-formed primary surfaces (i.e., designated as "fusion" in Tables 2A and 2B). Of the samples subjected to a low pH and high pH treatment, some of them were additionally subjected to an ion-exchange (IOX) treatment and the remaining samples were not subjected to an IOX treatment (all designated as "textured" in Tables 2A and 2B). Those articles subjected to an IOX treatment with glass-based substrates comprising a Glass A composition were treated according to the following treatments: (a) an immersion in a molten salt bath of 70 wt. % NaNO$_3$ and 30 wt. % KNO$_3$ at 380° C. for 4 hours; and (b) an immersion in a molten salt bath of 93 wt. % NaNO$_3$ and 7 wt. % KNO$_3$ at 380° C. for 40 minutes. Further, those articles subjected to an IOX treatment with glass-based substrates comprising Glass B and Glass C compositions were treated with an immersion in a molten salt bath of 100 wt. % KNO$_3$ at 420° C. for 5.5 hours.

Referring again to Tables 2A and 2B, some of the resulting articles fabricated according to the methods outlined above and listed in these tables are consistent with the articles 100b outlined earlier in the disclosure (i.e., samples designated with the prefix "Ex."), as prepared according to a method consistent with the methods outlined earlier in the disclosure. Other samples without a textured region were designated as comparative controls (i.e., those samples designated with the prefix "Comp. Ex."). And, as noted earlier, some of the articles were subjected to an IOX treatment (see Table 2A) and some were not subjected to any IOX treatment (see Table 2B).

Referring once again to Tables 2A and 2B, the articles of this example were subjected to characterization of their haze (%) and scratch resistance properties. The scratch resistance properties are evident from the reported Knoop Scratch Threshold (N) and average crack width (μm) values in these tables, as developed from the Knoop Scratch Test. As is evident from the data in Tables 2A and 2B associated with Glasses A-C, the articles with textured regions (i.e., the samples designated "textured") demonstrated improved scratch resistance relative to those articles without a textured region (i.e., the comparative samples designated "fusion" and "polish"). Moreover, the articles with textured regions cracked with a limited average maximum crack width; and the articles without a textured region failed at lower threshold load levels with larger average maximum crack widths. These same trends were also observed in comparing the articles subjected to an IOX treatment to those articles that were not subjected to an IOX treatment. That is, the articles subjected to an IOX treatment failed at higher threshold levels and smaller average crack widths in comparison to articles that were not subjected to an IOX treatment. Accordingly, the articles possessing a textured region and subjected to an IOX treatment demonstrated the best performance in terms of scratch resistance.

Figure 8A:
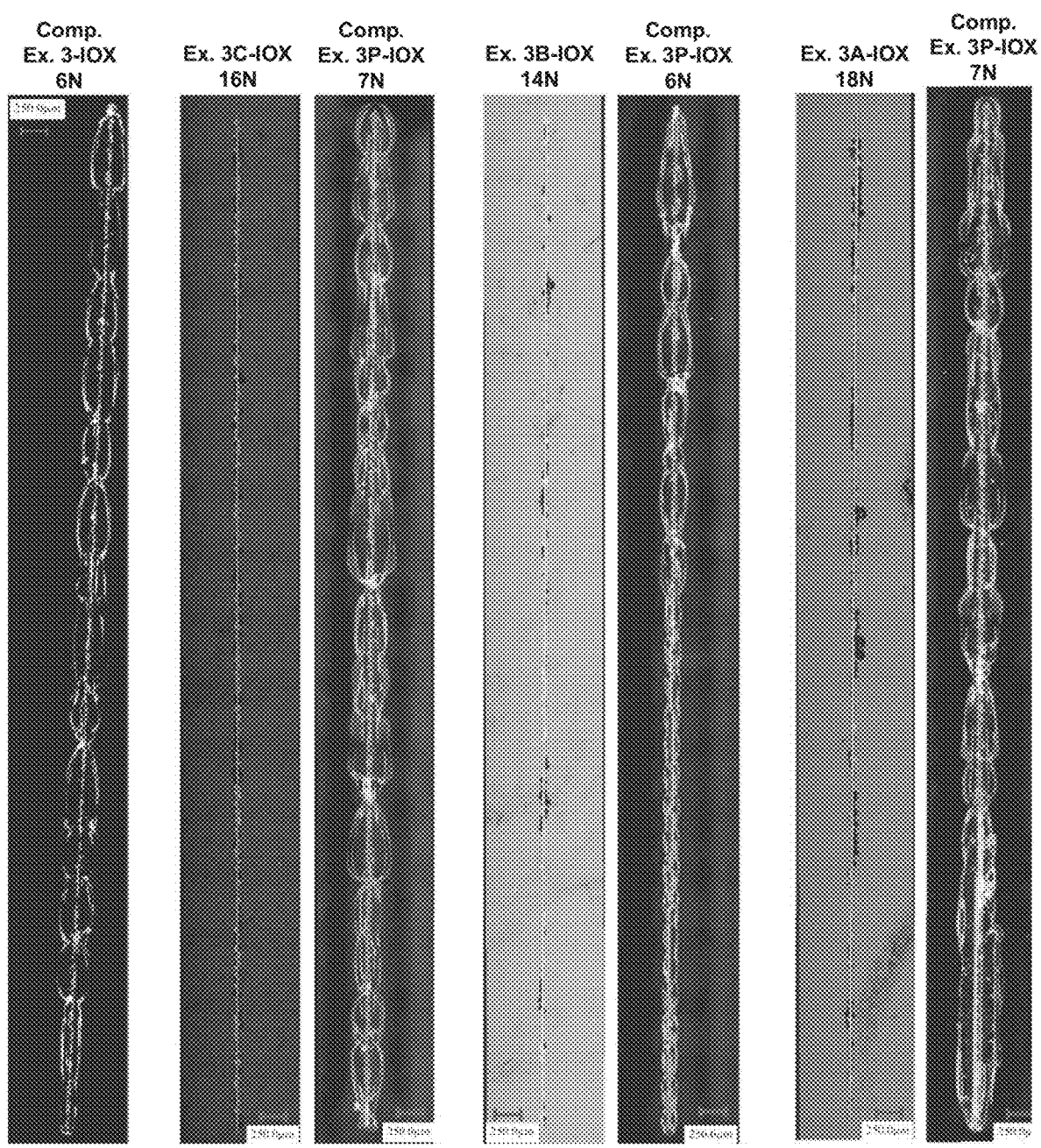
FIG. 8A is a series of optical micrographs of comparative articles comprising a glass-based substrate and articles according to the disclosure that comprise a glass-based substrate and a textured region, as tested with a Knoop Scratch Test.
Figure 8B:
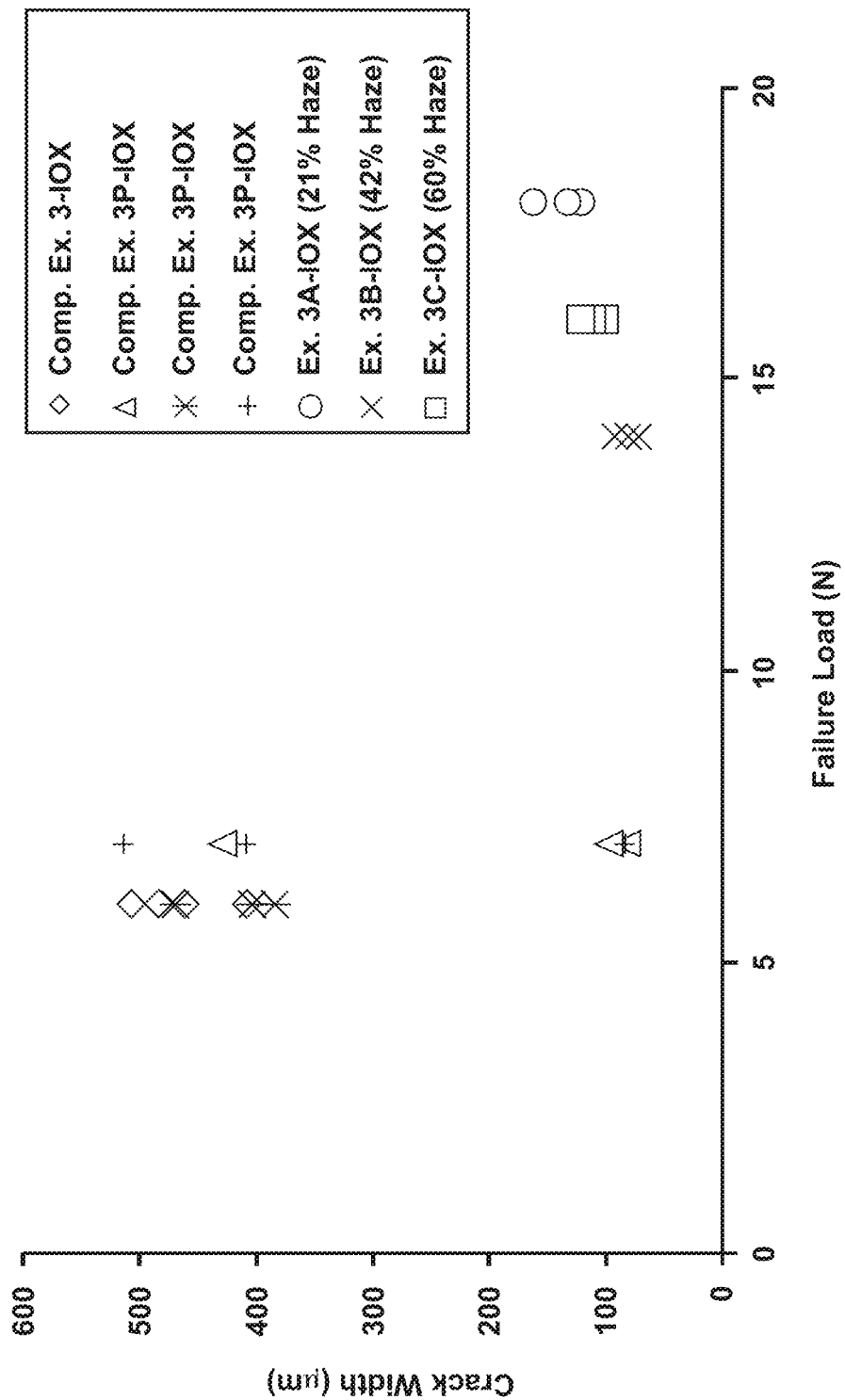
FIG. 8B is a plot of crack width vs. failure load of comparative articles comprising a glass-based substrate and articles according to the disclosure that comprise a glass-based substrate and a textured region, as tested with a Knoop Scratch Test.

Referring now to FIG. 8A, optical micrographs are provided of ion-exchanged samples having a Glass C composition from Table 2A (i.e., Ex. 3A-IOX, Ex. 3B-IOX, Ex. 3C-IOX, Comp. Ex. 3-1OX and Comp. Ex. 3P-IOX), after being subjected to the Knoop Scratch Test. As is evident from the micrographs shown in FIG. 8, the sample articles with a textured region demonstrated significantly higher Knoop Scratch Threshold values (e.g., from 14 N to 18 N) and smaller average maximum crack widths (<100 μm) as compared to the samples lacking a textured region (e.g., from 6N to 7N; and average maximum crack widths >>100 μm). Similarly, the plot of average maximum crack width (μm) vs. failure load (N), as developed through the Knoop Scratch Test and shown in FIG. 8B, demonstrates the same trend.

TABLE 2A

| Sample No. | Glass | Etchant | Etchant Conc. (wt. %) | Time (hr) | IOX | Surf. Cond. | Haze (%) | Knoop Scratch Thresh. (N) | Avg. Crack Width at Thresh. (μm) |
|---|---|---|---|---|---|---|---|---|---|
| Comp. Ex. 1-IOX | C | N/A | N/A | N/A | Yes | fusion | 0 | 7 | 75 |
| Comp. Ex. 1P-IOX | C | HCl | 5 | 13.5, 24 & 48 | Yes | polish | 0 | 10 | 300 |
| Ex. 1A-IOX | C | HCl | 5 | 13.5 | Yes | textured | 8.27 | 14 | 182 |
| Ex. 1B-IOX | C | HCl | 5 | 24 | Yes | textured | 19.20 | 8 | 209 |
| Ex. 1C-IOX | C | HCl | 5 | 48 | Yes | textured | 23.90 | 8 | 82 |
| Comp. Ex. 2-IOX | B | N/A | N/A | N/A | Yes | fusion | 0 | 7 | 88 |
| Comp. Ex. 2P-IOX | B | citric | 20 | 8, 13.5 & 24 | Yes | polish | 0 | 9 | 113 |
| Ex. 2A-IOX | B | citric | 20 | 8 | Yes | textured | 1.43 | 16 | 100 |
| Ex. 2B-IOX | B | citric | 20 | 13.5 | Yes | textured | 19.10 | 16 | 109 |
| Ex. 2C-IOX | B | citric | 20 | 24 | Yes | textured | 61.50 | 14 | 109 |
| Comp. Ex. 3-IOX | A | N/A | N/A | N/A | Yes | fusion | 0 | 6 | 474 |
| Comp. Ex. 3P-IOX | A | citric | 20 | 10, 13.5 & 16 | Yes | polish | 0 | 6 | 319 |
| Ex. 3A-IOX | A | citric | 20 | 10 | Yes | textured | 20.8 | 17 | 136 |
| Ex. 3B-IOX | A | citric | 20 | 13.5 | Yes | textured | 41.9 | 14 | 79 |
| Ex. 3C-IOX | A | citric | 20 | 16 | Yes | textured | 60.0 | 16 | 108 |

TABLE 2B

| Sample No. | Glass | Etchant | Etchant Conc. (wt. %) | Time (hr) | IOX | Surf. Cond. | Haze (%) | Knoop Scratch Thresh. (N) | Avg. Crack Width at Thresh. (μm) |
|---|---|---|---|---|---|---|---|---|---|
| Comp. Ex. 1-nIOX | C | N/A | N/A | N/A | No | fusion | 0 | 3 | 280 |
| Comp. Ex. 1P-nIOX | C | HCl | 5 | 13.5, 24 & 48 | No | polish | 0 | 3 | 28 |
| Ex. 1A-nIOX | C | HCl | 5 | 13.5 | No | textured | 8.27 | 3 | 200 |
| Ex. 1B-nIOX | C | HCl | 5 | 24 | No | textured | 19.20 | 4 | 156 |
| Ex. 1C-nIOX | C | HCl | 5 | 48 | No | textured | 23.90 | 3 | 52 |
| Comp. Ex. 2-nIOX | B | N/A | N/A | N/A | No | fusion | 0 | 4 | 260 |
| Comp. Ex. 2P-nIOX | B | citric | 20 | 8, 13.5 & 24 | No | polish | 0 | 3 | 40 |
| Ex. 2A-nIOX | B | citric | 20 | 8 | No | textured | 1.43 | 3 | 32 |
| Ex. 2B-nIOX | B | citric | 20 | 13.5 | No | textured | 19.10 | 3 | 20 |
| Ex. 2C-nIOX | B | citric | 20 | 24 | No | textured | 61.50 | 6 | 68 |
| Comp. Ex. 3-nIOX | A | N/A | N/A | N/A | No | fusion | 0 | 4 | 280 |
| Comp. Ex. 3P-nIOX | A | citric | 20 | 10, 13.5 & 16 | No | polish | 0 | 3 | 44 |
| Ex. 3A-nIOX | A | citric | 20 | 10 | No | textured | 20.8 | 4 | 160 |
| Ex. 3B-nIOX | A | citric | 20 | 13.5 | No | textured | 41.9 | 5 | 240 |
| Ex. 3C-nIOX | A | citric | 20 | 16 | No | textured | 60.0 | 7 | 340 |

Example 4

Figure 9:
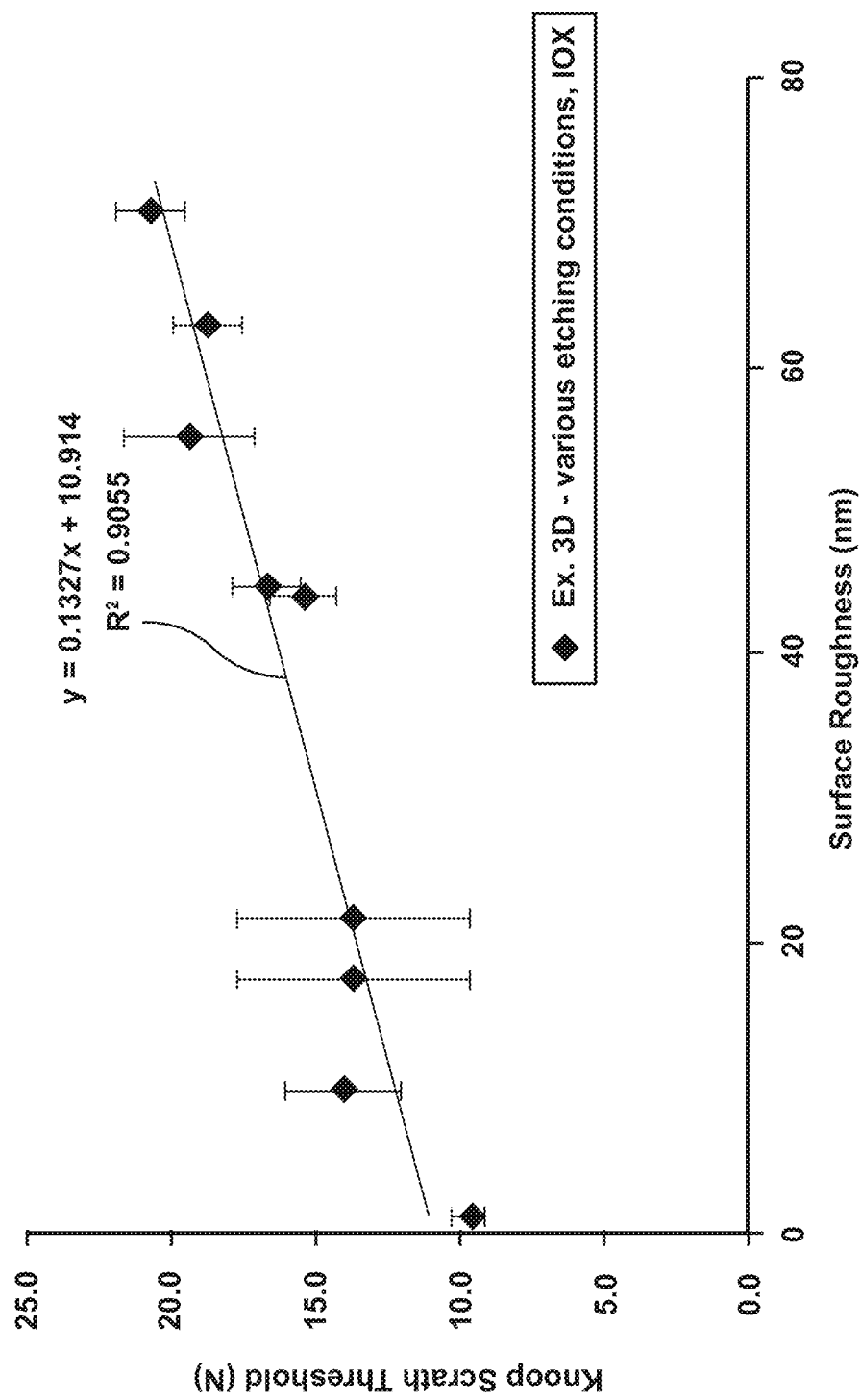
FIG. 9 is a plot of Knoop Scratch Threshold (KST) v. surface roughness of articles according to the disclosure that comprise a glass-based substrate and a textured region, as tested with a Knoop Scratch Test.

In this example, samples of Glass A were prepared and characterized according to Table 3 below. Each of these samples was etched in 20 wt. % citric acid at 95° C. for various times to obtain textured regions with the scratch roughness ($R_a$) levels listed in Table 3. All samples were rinsed in deionized water and dried at room temperature after the etching step. Further, the samples were then subjected to a high pH treatment employing an alkali cleaner having a pH of about 13 at 60° C. for 10 min, followed by rinsing in deionized water and ambient temperature drying. Further, each of the samples was subjected to an IOX treatment according to the following conditions: (a) an immersion in a molten salt bath of 70 wt. % $NaNO_3$ and 30 wt. % $KNO_3$ at 380° C. for 4 hours; and (b) an immersion in a molten salt bath of 93 wt. % $NaNO_3$ and 7 wt. % $KNO_3$ at 380° C. for 40 minutes (collectively, all samples designated "Ex. 3D—various etching conditions, IOX"). Finally, each of the samples was subjected to the Knoop Scratch Test, with Knoop Scratch Threshold (N) values reported in Table 3. In addition, FIG. 9 provides a plot of the data from Table 3, i.e., Knoop Scratch Threshold (N) vs. surface roughness, $R_a$ (nm). As the results from Table 3 and FIG. 9 demonstrate, articles with textured regions (e.g., as consistent with the articles 100b shown in FIG. 1A) with increasing levels of surface roughness exhibit increasing levels of scratch resistance, as manifested by increasing Knoop Scratch Threshold levels.

TABLE 3

| Sample | Haze (%) | $R_a$ (nm) | Knoop Scratch Threshold (N) | | |
|---|---|---|---|---|---|
| Ex. 3D #1 | 0.001 | 1 | 9 | 10 | 10 |
| Ex. 3D #2 | 0.14 | 9.78 | 12 | 14 | 16 |
| Ex. 3D #3 | 0.83 | 17.5 | 9 | 16 | 16 |
| Ex. 3D #4 | 1.39 | 21.6 | 9 | 16 | 16 |
| Ex. 3D #5 | 7.98 | 44.04 | 14 | 16 | 16 |
| Ex. 3D #6 | 7.86 | 44.6 | 16 | 16 | 18 |
| Ex. 3D #7 | 12.98 | 55.2 | 18 | 18 | 22 |
| Ex. 3D #8 | 16.6 | 62.76 | 18 | 18 | 20 |
| Ex. 3D #9 | 21.5 | 70.87 | 20 | 20 | 22 |

Many variations and modifications may be made to the above-described embodiments of the disclosure without departing substantially from the spirit and various principles of the disclosure. All such modifications and variations are intended to be included herein within the scope of this disclosure and protected by the following claims.

What is claimed is:

1. An article, comprising:
a glass-based substrate comprising a thickness, a primary surface and a compressive stress region that extends from the primary surface to a selected depth; and
a textured region defined by the primary surface,
wherein the textured region comprises a surface roughness ($R_a$) of at least 10 nm,
wherein the textured region comprises a plurality of exposed features having an average feature size of less than 2 microns, and
further wherein the article comprises a Knoop Scratch Threshold (KST) of at least 9 Newtons (N).

2. The article according to claim 1, wherein the glass-based substrate is selected from the group consisting of an aluminosilicate glass, a borosilicate glass, and a phosphosilicate glass.

3. The article according to claim 1, wherein the plurality of exposed features of the textured region has an average feature size of less than 1 micron.

4. The article according to claim 1, wherein the textured region comprises a surface roughness ($R_a$) from about 50 nm to about 200 nm.

5. The article according to claim 1, wherein the article is characterized by a haze from about 0.1% to about 100%.

6. The article according to claim 1, wherein the article is characterized by a haze from about 5% to about 65%.

7. A consumer electronic product, comprising:
a housing having a front surface, a back surface and side surfaces;
electrical components provided at least partially within the housing, the electrical components including at least a controller, a memory, and a display, the display being provided at or adjacent to the front surface of the housing; and
a cover substrate disposed over the display, wherein at least one of a portion of the housing or the cover substrate comprises the article of claim 1.

8. An article, comprising:

a glass-based substrate comprising a thickness, a primary surface and a compressive stress region that extends from the primary surface to a selected depth; and a textured region defined by the primary surface, wherein the article comprises a Knoop Scratch Threshold (KST) of at least 9 Newtons (N), and further wherein the textured region comprises a plurality of exposed features having an average feature size of less than 2 microns.

9. The article according to claim 8, wherein the glass-based substrate is selected from the group consisting of an aluminosilicate glass, a borosilicate glass, and a phosphosilicate glass.

10. The article according to claim 8, wherein the article comprises a Knoop Scratch Threshold (KST) from 9N to about 18N.

11. The article according to claim 8, wherein the article comprises a Knoop Scratch Threshold (KST) from about 18N to about 22N.

12. The article according to claim 8, wherein the plurality of exposed features of the textured region has an average feature size of less than 1 micron.

13. The article according to claim 8, wherein the article is characterized by a haze from about 0.1% to about 100%.

14. The article according to claim 8, wherein the article is characterized by a haze from about 5% to about 65%.

15. A consumer electronic product, comprising:

a housing having a front surface, a back surface and side surfaces;

electrical components provided at least partially within the housing, the electrical components including at least a controller, a memory, and a display, the display being provided at or adjacent to the front surface of the housing; and a cover substrate disposed over the display, wherein at least one of a portion of the housing or the cover substrate comprises the article of claim 8.

16. A method of making an article, comprising:

etching an initial primary surface of a glass-based substrate having a thickness with a first etchant having a pH of about 3 or less, wherein the etching is conducted above ambient temperature and below 100° C. to form a porous leached layer defined by the initial primary surface of the glass-based substrate;

treating the glass-based substrate with a second etchant having a pH of about 9 or greater to remove the leached layer and form a textured region defined by a primary surface of the glass-based substrate, wherein the treating is conducted above ambient temperature; and forming a compressive stress region that extends from the primary surface to a selected depth, wherein the article comprises a Knoop Scratch Threshold (KST) of at least 9 Newtons (N), and further wherein the textured region comprises a plurality of exposed features having an average feature size of less than 2 microns.

17. The method according to claim 16, wherein the textured region further comprises a surface roughness ($R_a$) of at least 10 nm.

18. The method according to claim 16, wherein the article is characterized by a haze from about 0.1% to about 100%.

19. The method according to claim 16, wherein the step of forming a compressive stress region is conducted according to an ion-exchange process.

\* \* \* \* \*